(12) United States Patent
Huang et al.

(10) Patent No.: US 12,446,276 B2
(45) Date of Patent: Oct. 14, 2025

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Hsin-Chieh Huang, Taoyuan (TW); Chia-Cheng Chao, Hsinchu (TW); Yu-Wen Wang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 913 days.

(21) Appl. No.: 17/492,315

(22) Filed: Oct. 1, 2021

(65) Prior Publication Data

US 2022/0344460 A1 Oct. 27, 2022

Related U.S. Application Data

(60) Provisional application No. 63/178,258, filed on Apr. 22, 2021.

(51) Int. Cl.
| | | |
|---|---|---|
| *H10D 62/10* | (2025.01) | |
| *H10D 30/01* | (2025.01) | |
| *H10D 30/67* | (2025.01) | |

(52) U.S. Cl.
CPC ......... *H10D 62/118* (2025.01); *H10D 30/031* (2025.01); *H10D 30/6735* (2025.01); *H10D 30/6757* (2025.01)

(58) Field of Classification Search
CPC .......... H01L 29/0665; H01L 29/42392; H01L 29/66742; H01L 29/78696; H01L 21/823878; H01L 27/088; H01L 21/823481; H01L 29/0673; H01L 29/66439; H01L 29/7848; H01L 29/66545; H01L 29/66553; H01L 29/785; H10D 62/118; H10D 30/031; H10D 30/6735; H10D 30/6757; H10D 30/797; H10D 30/43; H10D 64/017; H10D 30/014; H10D 62/82; H10D 62/822; H10D 62/85; H10D 62/121; H10D 84/83; H10D 84/0188; H10D 84/85; H10D 84/0151; H10D 84/038; H10D 30/62; H10D 64/018; H10D 30/501;
(Continued)

(56) References Cited

U.S. PATENT DOCUMENTS

| | | | |
|---|---|---|---|
| 2016/0276342 A1* | 9/2016 | Lim | H01L 21/823821 |
| 2016/0276429 A1* | 9/2016 | Tseng | H01L 21/823431 |
| 2018/0138092 A1* | 5/2018 | Lee | H01L 21/823437 |

(Continued)

*Primary Examiner* — Ajay Ojha
*Assistant Examiner* — Sandra Milena Rodriguez Villanu
(74) *Attorney, Agent, or Firm* — FOLEY & LARDNER LLP

(57) ABSTRACT

A semiconductor device includes a first channel structure extending along a first lateral direction and a second channel structure extending along the first lateral direction. The second channel structure is spaced apart from the first channel structure. The semiconductor device further includes a high-k dielectric structure extending along the first lateral direction and disposed between the first and second channel structures. The high-k dielectric structure has a bottom surface that comprises a bottommost portion and at least a first plateau portion elevated from the bottommost portion.

20 Claims, 25 Drawing Sheets

(58) Field of Classification Search
CPC .... H10D 30/502; H10D 30/01; H10D 30/019; H10D 62/119; B82Y 10/00; Y10S 977/938
See application file for complete search history.

(56) References Cited

U.S. PATENT DOCUMENTS

| | | | |
|---|---|---|---|
| 2019/0189739 A1* | 6/2019 | Li | H01L 29/0673 |
| 2021/0020644 A1* | 1/2021 | Paul | H01L 21/28088 |
| 2021/0057535 A1* | 2/2021 | Chiang | H01L 29/0847 |

* cited by examiner

SEMICONDUCTOR DEVICES AND METHODS OF MANUFACTURING THEREOF

CROSS-REFERENCE TO RELATED APPLICATION

This application claims priority to and the benefit of U.S. Provisional Application No. 63/178,258, filed Apr. 22, 2021, entitled "U-SHAPE HK PROFILE BY WET LINER TRIM FOR CEFF IMPROVEMENT," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
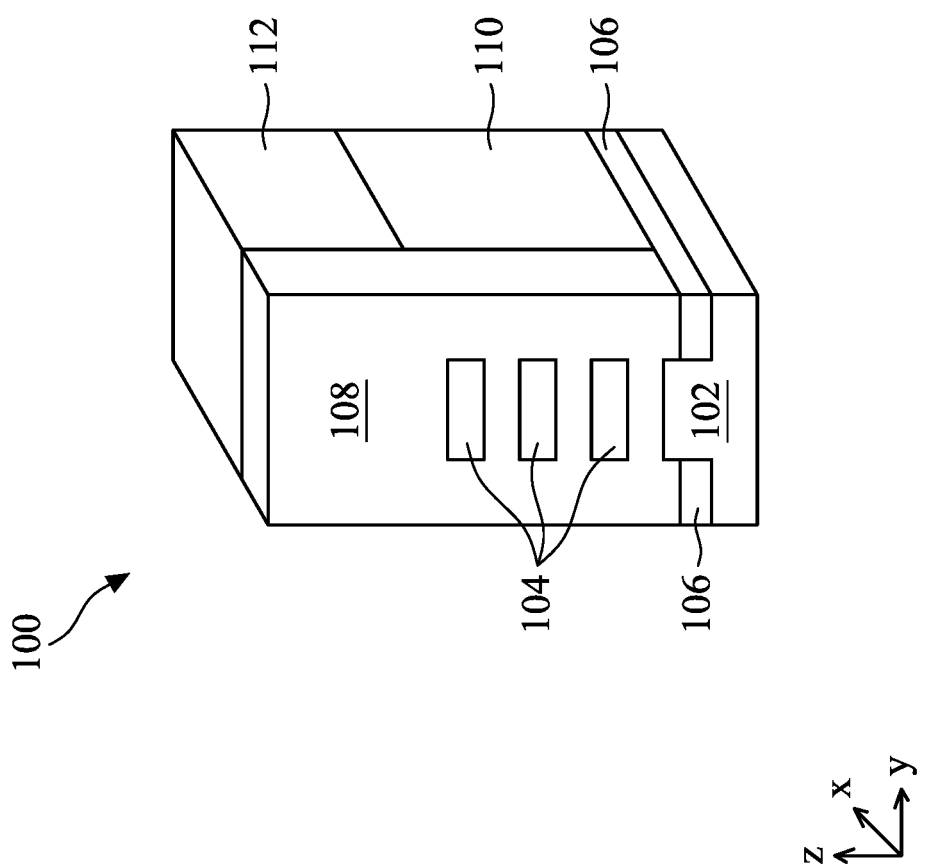
FIG. 1 illustrates a perspective view of a nanostructure transistor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors are fabricated on a single wafer. Non-planar transistor device architectures, such as fin-based transistors (typically referred to as "FinFETs"), can provide increased device density and increased performance over planar transistors. Some advanced non-planar transistor device architectures such as nanostructure transistors (e.g., nanosheet transistors, nanowire transistors, gate-all-around transistor, multi-bridge-channel transistor, nanoribbon transistor, etc.) can obtain great performance. The nanostructure transistor, in general, includes a gate structure that wraps around the perimeter of one or more nanostructures for improved control of channel current flow The present disclosure provides various embodiments of a non-planar transistor device that includes a high-k dielectric structure disposed between gate structures overlaying respective channel structures. With the high-k dielectric structure, the gate structures can be electrically isolated from each other. For example, to form the high-k dielectric structure, a cladding layer, a nitride-based dielectric layer, and an oxide-based layer may be formed in a trench between the two channel structures. A portion of the nitride-based dielectric layer may be etched with a first agent while keeping other layers substantially intact, resulting in the formation of a tilted portion along the nitride-based dielectric layer. Next, a portion of the cladding layer may be etched with a second agent while substantially limiting an etched amount of the nitride-based dielectric layer and/or the oxide-based layer, resulting in the formation of a plateau portion along the cladding layer. The high-k dielectric structure can then be formed by filling such a recess (e.g., defined by the etched oxide-based layer, etched nitride-based dielectric layer, and etched cladding layer) with a high-k dielectric material. The method of a combination of selective etching steps, as disclosed herein, allows the high-k dielectric structure to be formed wider and shallower (e.g., downwardly extending with a less depth). The disclosed high-k dielectric structure with such a wider and shallower profile can significantly reduce parasitic capacitance coupled to the gate structures formed adjacent the high-k dielectric structure. For example, parasitic capacitance coupled between the gate structure and a neighboring contact structure coupled to an epitaxial structure can be reduced up to about 1.6%. As such, a parasitic delay (e.g., an RC delay) associated with the parasitic capacitance can be significantly reduced accordingly.

FIG. 1 illustrates a perspective view of a non-planar transistor device 100, in accordance with various embodiments. In accordance with some embodiments, the non-planar device 100 includes a nanostructure transistor device. However, it should be understood that the device 100 can include any of various other types of transistor configurations, while remaining within the scope of present disclosure.

The nanostructure transistor device 100 includes a substrate 102 and a number of semiconductor layers 104 that may contain nanostructures (e.g., nanosheets, nanowires, etc.) above the substrate 102. The semiconductor layers 104 (which may sometimes be collectively referred to as a channel structure) are vertically separated from one another. Isolation structure 106 are formed on opposing ends of a protruded portion of the substrate 102 with the semiconductor layers 104 disposed above the protruded portion. A gate structure 108 wraps around each of the semiconductor layers 104 (e.g., a full perimeter of each of the semiconductor layers 104). Epitaxial structures 110 which may include source and drain regions are disposed on opposing sides of the gate structure 108. An interlayer dielectric (ILD) 112 is disposed over the epitaxial structure 110. FIG. 1 depicts a simplified nanostructure transistor device, and thus, it should be understood that one or more features of a completed nanostructure transistor device may not be shown in FIG. 1. For example, the other epitaxial structure opposite the gate structure 108 from the epitaxial structure 110 and the ILD disposed over such an epitaxial structure are not shown in FIG. 1.

Figure 2A:
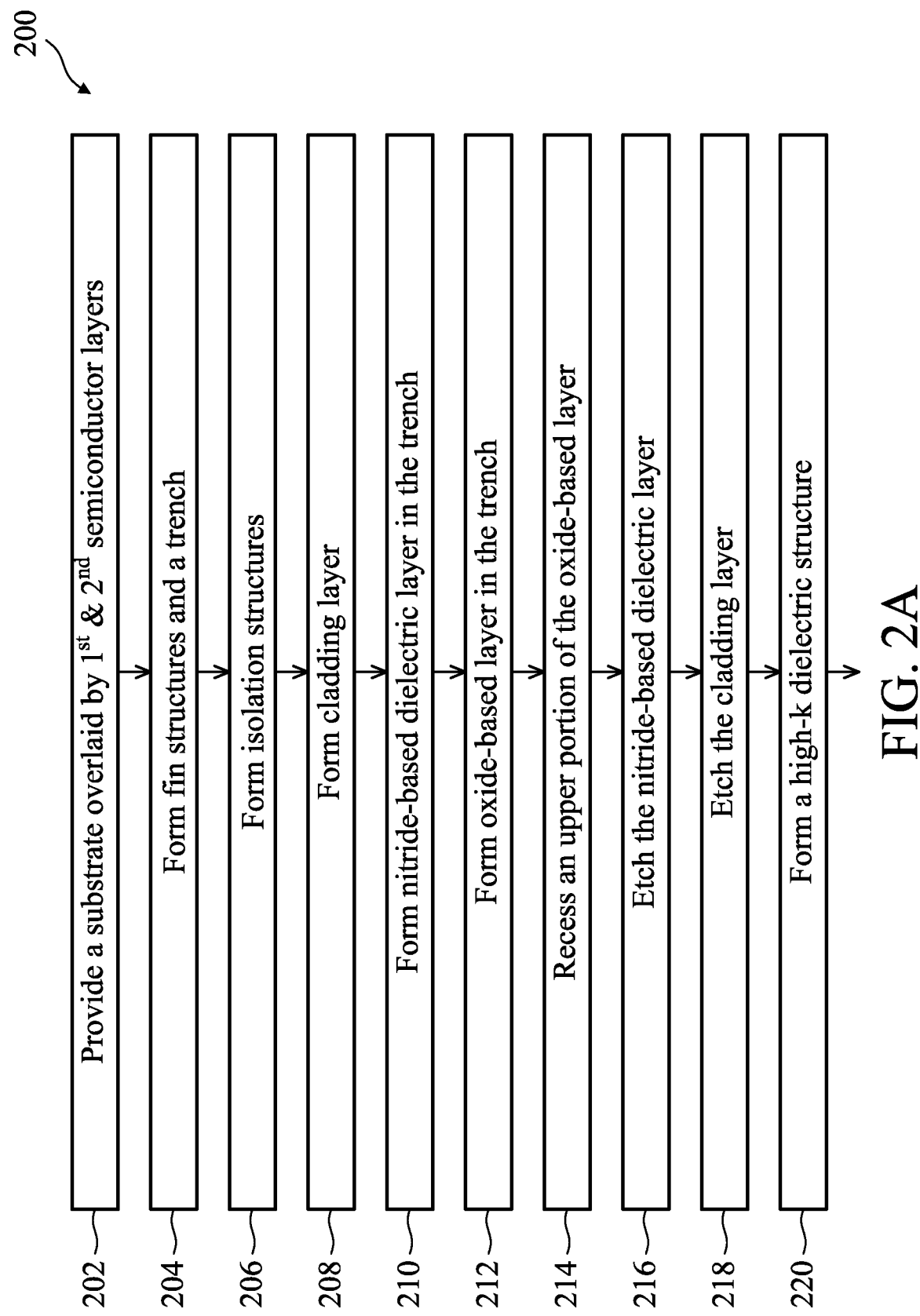
FIGS. 2A-B illustrates a flow chart of an example method for making a non-planar transistor device, in accordance with some embodiments.
Figure 2B:
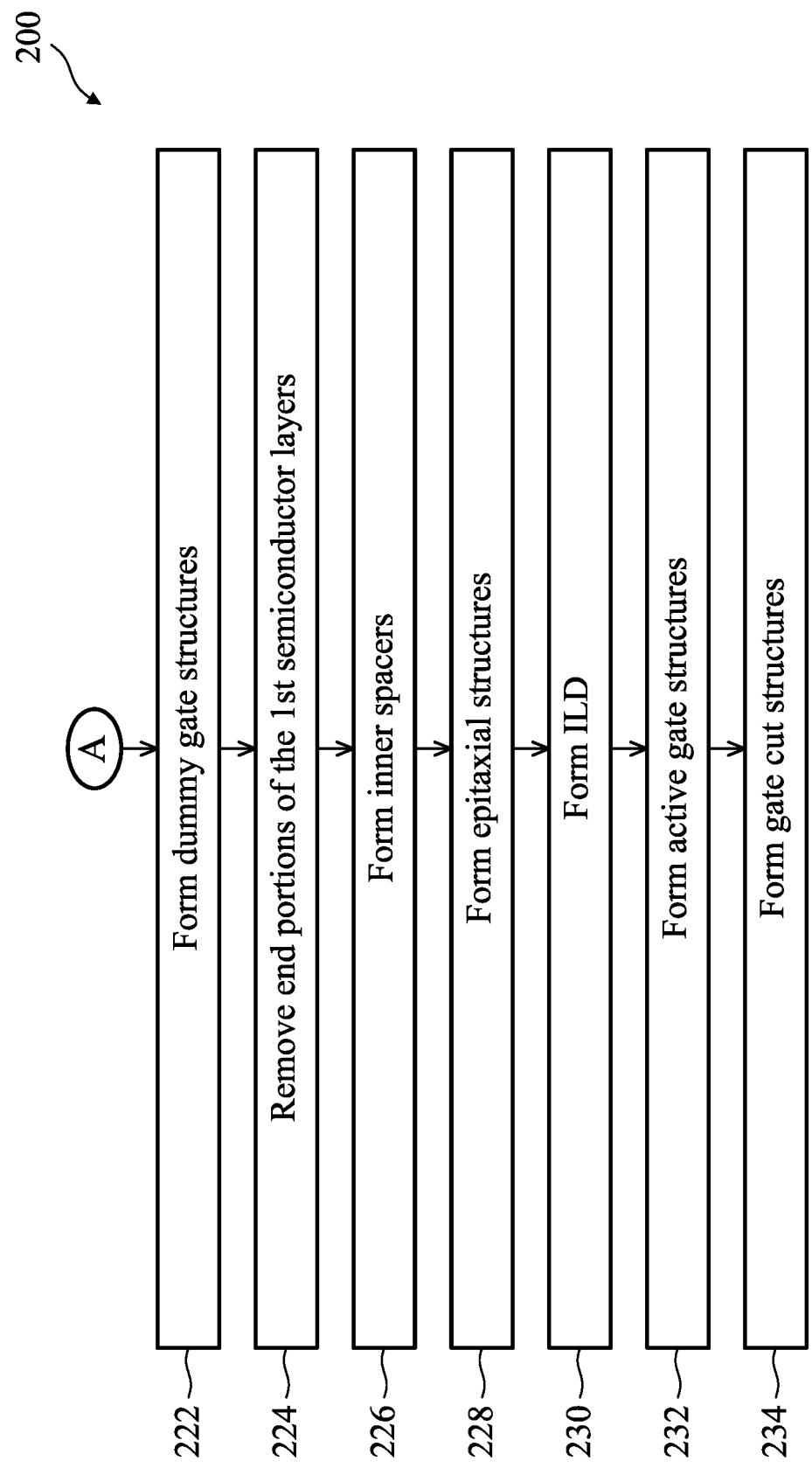

FIG. 2 illustrates a flowchart a method 200 to form a non-planar transistor device, according to one or more embodiments of the present disclosure. For example, at least some of the operations (or steps) of the method 200 can be used to form a nanostructure transistor device such as, for example, a nanostructure transistor device, a nanosheet transistor device, a nanowire transistor device, a vertical transistor device, or the like. Further, the method 200 can be used to form a nanostructure transistor device in a respective conduction type such as, for example an n-type nanostructure transistor device or a p-type nanostructure transistor device. The term "n-type," as used herein, may be referred to as the conduction type of a transistor having electrons as its conduction carriers; and the term "p-type," as used herein, may be referred to as the conduction type of a transistor having holes as its conduction carriers.

It is noted that the method 200 is merely an example, and is not intended to limit the present disclosure. Accordingly, it is understood that additional operations may be provided before, during, and after the method 200 of FIG. 2, and that some other operations may only be briefly described herein. In various embodiments, operations of the method 200 may be associated with perspective views of an example nanostructure transistor device at various fabrication stages as shown in FIGS. 3, 4, 5, 6, 7, 8A, 9A, 10A, 11A, 12, 13, 14, 15, 16, 17A, and 18A. For purposes of clarity of illustration, FIGS. 8B, 9B, 10B, 11B, 17B, and 18B illustrate cross-sectional views of the example nanostructure transistor device corresponding to FIGS. 8A, 9A, 10A, 11A, 17A, and 18A, respectively.

In a brief overview, the method 200 starts at operation 202 of providing a substrate overlaid by a number of first semiconductor layers and a number of second semiconductor layers. The method 200 continues to operation 204 in which fin structures and a trench are formed. The method 200 continues to operation 206 in which isolation structures are formed. The method 200 continues to operation 208 in which a cladding layer is formed. The method 200 continues to operation 210 in which a nitride-based dielectric layer is formed in the trench. The method 200 continues to operation 212 in which an oxide-based layer is formed in the trench. The method 200 continues to operation 214 in which an upper portion of the oxide-based layer is recessed. The method 200 continues to operation 216 in which the nitride-based dielectric layer is etched. The method 200 continues to operation 218 in which the cladding layer is etched. The method 200 continues to operation 220 in which a high-k dielectric structure is formed.

The method 200 continues to operation 222 in which dummy gate structures are formed. The method 200 continues to operation 224 in which end portions of the first semiconductor layers are removed. The method 200 continues to operation 226 in which inner spacers are formed. The method 200 continues to operation 228 in which epitaxial structures are formed. The method 200 continues to operation 230 in which an interlayer dielectric (ILD) is formed. The method 200 continues to operation 232 in which active gate structures are formed. The method 200 continues to operation 234 in which gate cut structures are formed.

As mentioned before, FIGS. 3-18B each illustrate, in either a cross-sectional or perspective view, a portion of a nanostructure transistor device 300, either in n-type or p-type, at various fabrication stages of the method 200 of FIG. 2. For example, FIGS. 3-8A, 9A, 10A, 11A, 12-17A, and 18A illustrate perspective views of the nanostructure transistor device 300. FIGS. 8B, 9B, 10B, 11B, 17B, and 18B illustrate cross-sectional views of the nanostructure transistor device 300 along the X-direction which corresponds to a cross-section cut along the longitudinal direction of the gate trench or the active gate structure. FIGS. 8B, 9B, 10B, 11B, 17B, and 18B illustrate correspond to FIGS. 8A, 9A, 10A, 11A, 17A, and 18A, respectively. Although FIGS. 3-18B illustrate the nanostructure transistor device 300, it is understood the nanostructure transistor device 300 may include a number of other devices such as inductors, fuses, capacitors, coils, etc., which are not shown in FIGS. 3-18B, for purposes of clarity of illustration.

Figure 3:
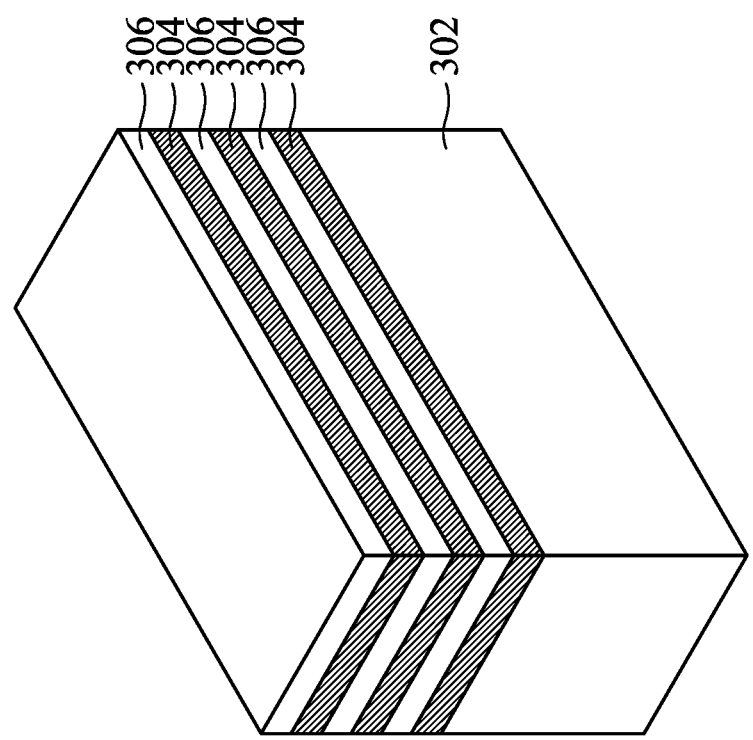
FIGS. 3, 4, 5, 6, 7, 8A, 9A, 10A, 11A, 12, 13, 14, 15, 16, 17A, and 18A illustrate perspective views of an example nanostructure transistor device (or a portion of the example nanostructure transistor device) during various fabrication stages, made by the method of FIG. 2A-B, in accordance with some embodiments.

Corresponding to operation 202 of FIG. 2, FIG. 3 is a perspective view of a nanostructure transistor device 300 including a number of first semiconductor layers 304 and a number of second semiconductor layers 306 formed on a semiconductor substrate 302 at one of the various stages of fabrication. As shown in the illustrated example of FIG. 3, the semiconductor layers 304 and 306 are formed as a stack over the semiconductor substrate 302.

The semiconductor substrate 302 includes a semiconductor material substrate, for example, silicon. Alternatively, the semiconductor substrate 302 may include other elementary semiconductor material such as, for example, germanium. The semiconductor substrate 302 may also include a compound semiconductor such as silicon carbide, gallium arsenic, indium arsenide, and indium phosphide. The semiconductor substrate 302 may include an alloy semiconductor such as silicon germanium, silicon germanium carbide, gallium arsenic phosphide, and gallium indium phosphide. In one embodiment, the semiconductor substrate 302 includes an epitaxial layer. For example, the semiconductor substrate 302 may have an epitaxial layer overlying a bulk semiconductor. Furthermore, the semiconductor substrate 302 may include a semiconductor-on-insulator (SOI) structure. For example, the semiconductor substrate 302 may include a buried oxide (BOX) layer formed by a process such as separation by implanted oxygen (SIMOX) or other suitable technique, such as wafer bonding and grinding.

The first semiconductor layers 304 and the second semiconductor layers 306 are alternatingly disposed on top of one another (e.g., along the Z direction) to form a stack. For example, one of the second semiconductor layers 306 is disposed over one of the first semiconductor layers 304 then another one of the first semiconductor layers 304 is disposed over the second semiconductor layer 306, so on and so forth.

The stack may include any number of alternately disposed semiconductor layers 304 and 306. The semiconductor layers 304 and 306 may have different thicknesses. The first semiconductor layers 304 may have different thicknesses from one layer to another layer. The second semiconductor layers 306 may have different thicknesses from one layer to another layer. The thickness of each of the semiconductor layers 304 and 306 may range from few nanometers to few tens of nanometers. The first layer of the stack may be thicker than other semiconductor layers 304 and 306. In an embodiment, each of the first semiconductor layers 304 has a thickness ranging from about 5 nanometers (nm) to about 20 nm, and each of the second semiconductor layers 306 has a thickness ranging from about 5 nm to about 20 nm. Either the first semiconductor layer 304 or the second semiconductor layer 306 may be the topmost layer (or the layer most distanced from the semiconductor substrate 302). Either the first semiconductor layer 304 or the second semiconductor layer 306 may be the bottommost layer (or the layer most proximate to the semiconductor substrate 302).

The two semiconductor layers 304 and 306 have different compositions. In various embodiments, the two semiconductor layers 304 and 306 have compositions that provide for different oxidation rates and/or different etch selectivity between the layers. In an embodiment, the first semiconductor layers 304 include silicon germanium ($Si_{1-x}Ge_x$), and the second semiconductor layers 306 include silicon (Si). In an embodiment, each of the second semiconductor layers 306 is silicon that may be undoped or substantially dopant-free (i.e., having an extrinsic dopant concentration from about $0 \text{ cm}^{-3}$ to about $1 \times 10^{17} \text{ cm}^{-3}$), where for example, no intentional doping is performed when forming the layers 306 (e.g., of silicon).

In various embodiments, the second semiconductor layers 306 may be intentionally doped. For example, when the nanostructure transistor device 300 is configured in n-type (and operates in an enhancement mode), each of the second semiconductor layers 306 may be silicon that is doped with a p-type dopant such as boron (B), aluminum (Al), indium (In), and gallium (Ga); and when the nanostructure transistor device 300 is configured in p-type (and operates in an enhancement mode), each of the second semiconductor layers 306 may be silicon that is doped with an n-type dopant such as phosphorus (P), arsenic (As), antimony (Sb). In another example, when the nanostructure transistor device 300 is configured in n-type (and operates in a depletion mode), each of the second semiconductor layers 306 may be silicon that is doped with an n-type dopant instead; and when the nanostructure transistor device 300 is configured in p-type (and operates in a depletion mode), each of the semiconductor layers 306 may be silicon that is doped with a p-type dopant instead. In some embodiments, each of the first semiconductor layers 304 is $Si_{1-x}Ge_x$ that includes less than 50% (x<0.5) Ge in molar ratio. For example, Ge may comprise about 15% to 35% of the first semiconductor layers 304 of $Si_{1-x}Ge_x$ in molar ratio. Furthermore, the first semiconductor layers 304 may include different compositions among them, and the second semiconductor layers 306 may include different compositions among them.

Either of the semiconductor layers 304 and 306 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, any other suitable material, or combinations thereof. The materials of the semiconductor layers 304 and 306 may be chosen based on providing differing oxidation rates and/or etch selectivity.

The semiconductor layers 304 and 306 can be grown from the semiconductor substrate 302. For example, each of the semiconductor layers 304 and 306 may be grown by a molecular beam epitaxy (MBE) process, a chemical vapor deposition (CVD) process such as a metal organic CVD (MOCVD) process, and/or other suitable growth processes. During the epitaxial growth, the crystal structure of the semiconductor substrate 302 extends upwardly, resulting in the semiconductor layers 304 and 306 having the same crystal orientation with the semiconductor substrate 302. The semiconductor layers 304 and 306 continuously extend along the X-direction.

Figure 4:
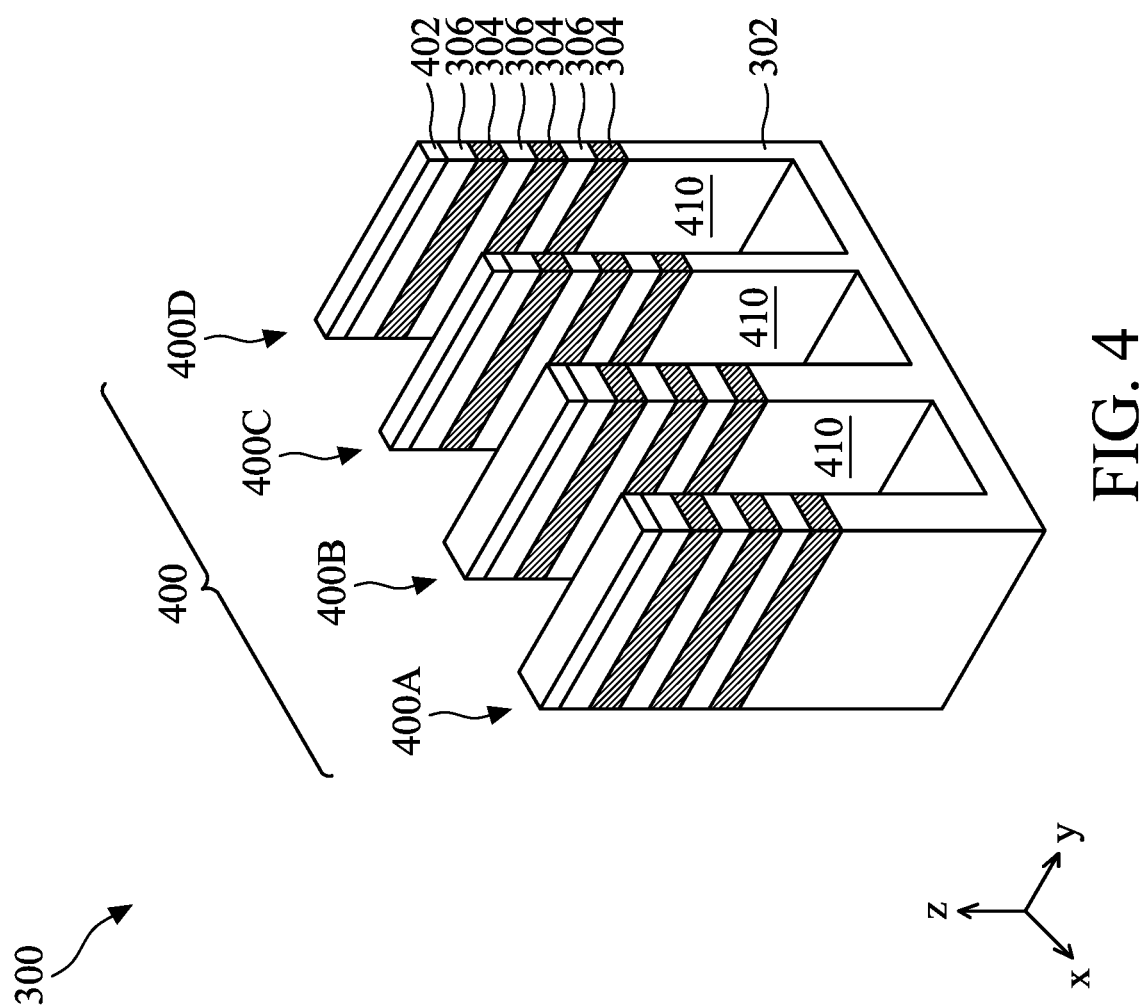

Corresponding to operation 204 of FIG. 2, FIG. 4 is a perspective view of the nanostructure transistor device 300 including a number of fin structures 400A, 400B, 400C, and 400D (which may sometimes be referred to as fin structures 400) at one of the various stages of fabrication. Each of the fin structures 400, which is elongated along the Y-direction, can include a stack of semiconductor layers 304-306 alternatively stacked with each other. Although four fin structures are shown in the illustrated embodiment of FIG. 4 (and the following figures), it should be appreciated that the nanostructure transistor device 300 can include any number of fin structures while remaining within the scope of the present disclosure.

The fin structures 400 are formed by patterning the semiconductor layers 304-306 and the semiconductor substrate 302 using, for example, photolithography and etching techniques. For example, a mask layer (sometimes referred to as a hardmask layer) is formed over the topmost semiconductor layer 306 (FIG. 3). In one embodiment, the mask layer can include multiple layers such as, for example, a pad oxide layer and an overlying pad nitride layer. The pad oxide layer may be a thin film comprising silicon oxide formed, for example, using a thermal oxidation process. The pad oxide layer may act as an adhesion layer between the topmost semiconductor layer 306 (or the semiconductor layer 304 in some other embodiments) and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example. In another embodiment, the mask layer can include one or more layers, each of which is formed of a semiconductor material similar to the material of semiconductor layer 304 or 306. For example, the mask layer has a single layer formed of SiGe. In another example, the mask layer has a stack of a first layer and a second layer, in which the first layer is formed of SiGe and the second layer is formed of Si. In such an example where the mask layer contains a mix of a SiGe layer and a Si layer, the Si layer may be disposed above the SiGe layer. Further, a ratio of the SiGe to Si (e.g., a thickness of the SiGe layer and a thickness of the Si layer) may be less than 1, in accordance with various embodiments. In a non-limiting example, the thickness of the Si layer is about 40 nm and the thick of the SiGe layer is about 4 nm, with the ratio of about 1/10.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching.

For example, the photoresist material is used to pattern the mask layer to form a patterned mask 402, as illustrated in FIG. 4.

The patterned mask 402 is subsequently used to pattern exposed portions of the semiconductor layers 304-306 and the substrate 302 to form trenches (or openings) 410, thereby defining the fin structures 400 between adjacent trenches 410, as illustrated in FIG. 4. The trenches 410 continuously extend along the Y-direction. When multiple fin structures are formed, such a trench may be disposed between any adjacent ones of the fin structures. In some embodiments, the fin structures 400 are formed by etching trenches in the semiconductor layers 304-306 and the substrate 302 using, for example, reactive ion etch (ME), neutral beam etch (NBE), the like, any other suitable process, or combinations thereof. The etch may be anisotropic. In some embodiments, the trenches 410 may be strips (when viewed from the top) parallel to each other, and closely spaced with respect to each other. In some embodiments, the trenches 410 may be continuous and surround the fin structures 400.

In some embodiments, the fin structures 400 may be patterned to have the same widths along the X-direction. In other embodiments, the fin structures 400 may have different widths along the X-direction. In such embodiments, the nanostructure transistor device 300 may comprise a first region with fin structures with larger widths (e.g., 400A and 400B) and a second region with fin structures with smaller widths (e.g., 400C and 400D). Such embodiments may be expanded upon below.

Figure 5:
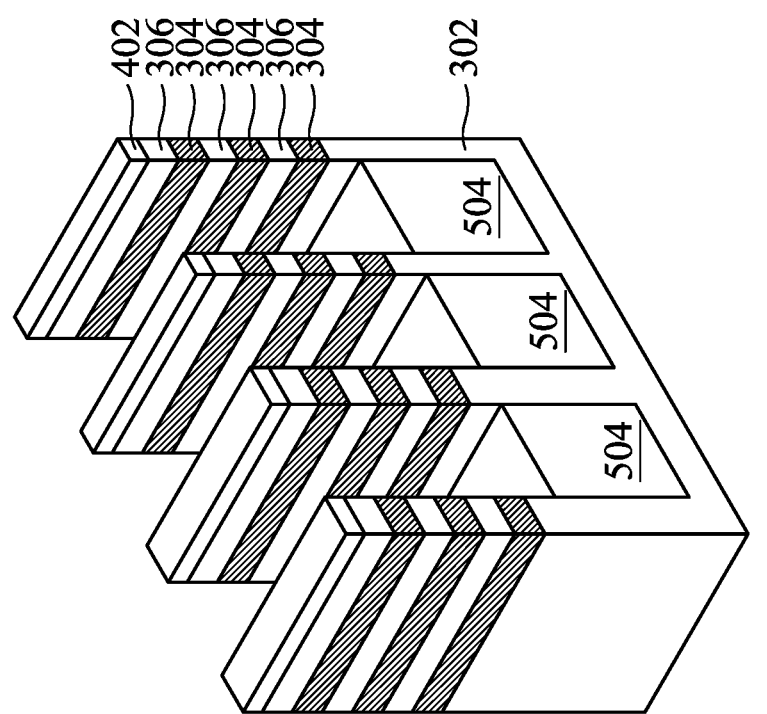

Corresponding to operation 206 of FIG. 2, FIG. 5 is a perspective view of the nanostructure transistor device 300 including isolation structures 504 (sometimes referred to as isolation regions) at one of the various stages of fabrication. As shown in FIG. 5, each of the isolation structures 504 can be disposed between adjacent ones of the fin structures 400, and partially embed respective lower portions of the adjacent fin structures 400.

The isolation structures 504, which are formed of an insulation material, can electrically isolate neighboring active structures (e.g., fin structures 400) from each other. The isolation structures 504 continuously extend in the Y-direction. The insulation material may be an oxide, such as silicon oxide, a nitride, the like, any other suitable material, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, any other suitable method, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process or any other suitable process, may remove any excess insulation material and form a top surface of the insulation material and a top surface of the patterned masks 402 that are coplanar (not shown).

Next, the insulation material is recessed to form the isolation structures 504, as shown in FIG. 5, which are sometimes referred to as shallow trench isolations (STIs). The isolation structures 504 are recessed such that the fin structures 400 protrude from between neighboring isolation structures 504. The isolation structures 504 may be recessed to where a top surface of the isolation structures 504 is below the substrate 302. Respective top surfaces of the isolation structures (STIs) 504 may have a flat surface (as illustrated), a convex surface, a concave surface (such as dishing), any other suitable surface, or combinations thereof. The top surfaces of the isolation structures 504 may be formed flat, convex, and/or concave by an appropriate etch. The isolation structures 504 may be recessed using an acceptable etching process, such as one that is selective to the material of the isolation structures 504. For example, a dry etch or a wet etch using dilute hydrofluoric (DHF) acid may be performed to recess the isolation structures 504.

Figure 6:
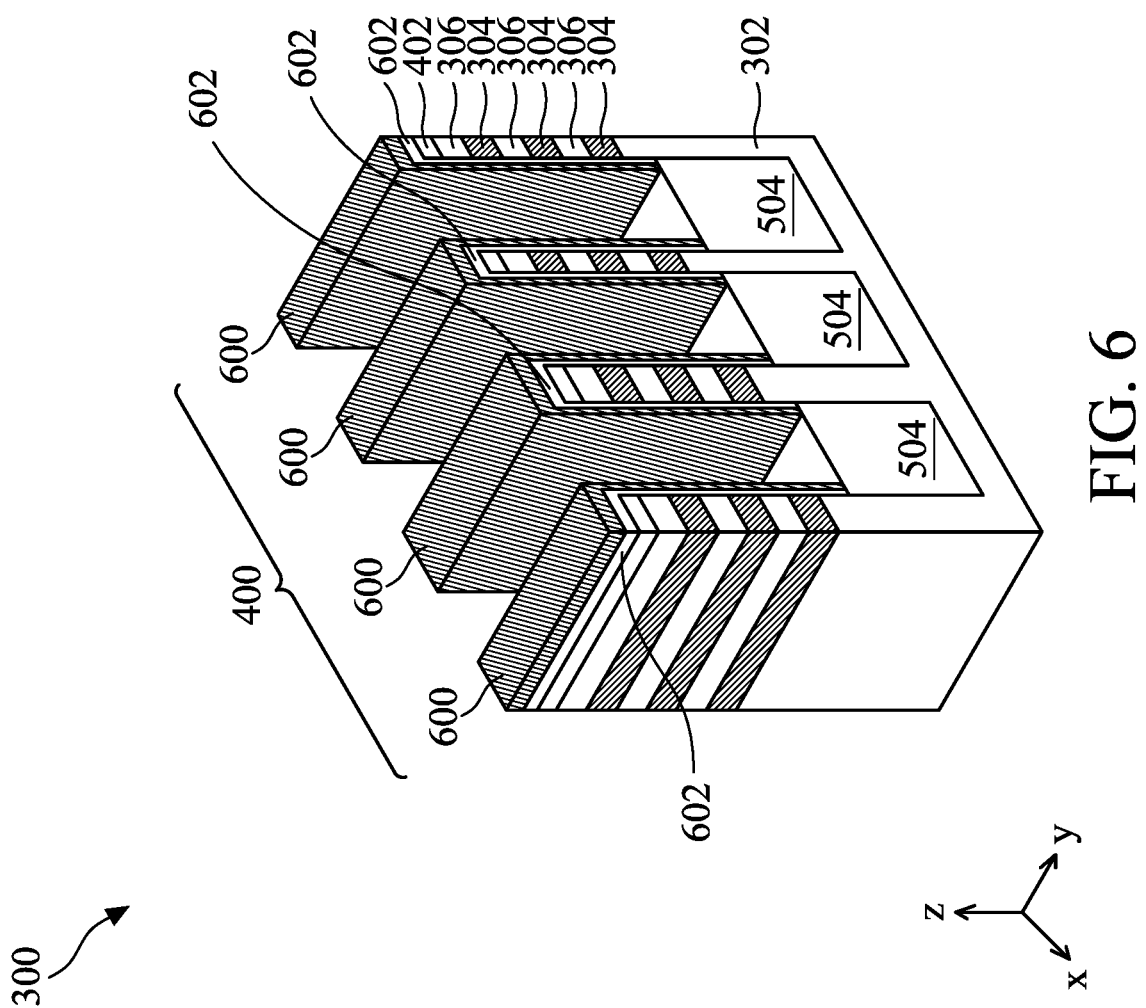

Corresponding to operation 208 of FIG. 2, FIG. 6 is a perspective view of the nanostructure transistor device 300 including a cladding layer 600 at one of the various stages of fabrication. As shown in FIG. 6, the cladding layer 600 can extend along a top portion and sidewalls of each of the fin structures 400 with a first oxide-based layer 602 optionally interposed therebetween.

After the isolation structures 504 are formed, the cladding layer 600 may be conformally deposited over the fin structures 400. For example, the cladding layer 600 can be formed to overlay the top surface (with the patterned mask 402, if still present, disposed therebetween) and extend along the sidewalls of each of the fin structures 400. In some embodiments, the cladding layer 600 may be epitaxially grown from the fin structures 400 (when no first oxide-based layer 602 is formed). As such, a majority of the cladding layer 600 is formed around the fin structures 400, with a minority of the cladding layer 600 formed to overlay the isolation structures 504, as shown in FIG. 6. The cladding layer 600 may include the same material as one of the alternating first and second semiconductor layers, for example, the semiconductor layers that function as sacrificial layers. The cladding layer may have a thickness in between about 1 and about 10 nanometers, inclusive (e.g., 1, 2, 3, 4, 5, 6, 7, 8, 9, or 10 nanometers). As will be discussed below, the first semiconductor layers 304 may be later removed to cause the second semiconductor layers 306 to be wrapped around by an active gate structure. Thus, in the example where the first semiconductor layers 304 include silicon germanium, the cladding layer 600 may also include silicon germanium.

In some embodiments, the first oxide-based layer 602 may first be conformally formed over the fin structures 400 prior to forming the cladding layer 600. The first oxide-based layer 602 can function as a portion of a gate dielectric, in some embodiments. The first oxide-based layer 602 may comprise a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD. In some embodiments, the first oxide-based layer 602 has a thickness in between about 1 and about 10 Angstroms, inclusive (e.g., 1, 2, 3, 4, 5, 6, 7, 8, 9, and 10 Angstroms).

Figure 7:
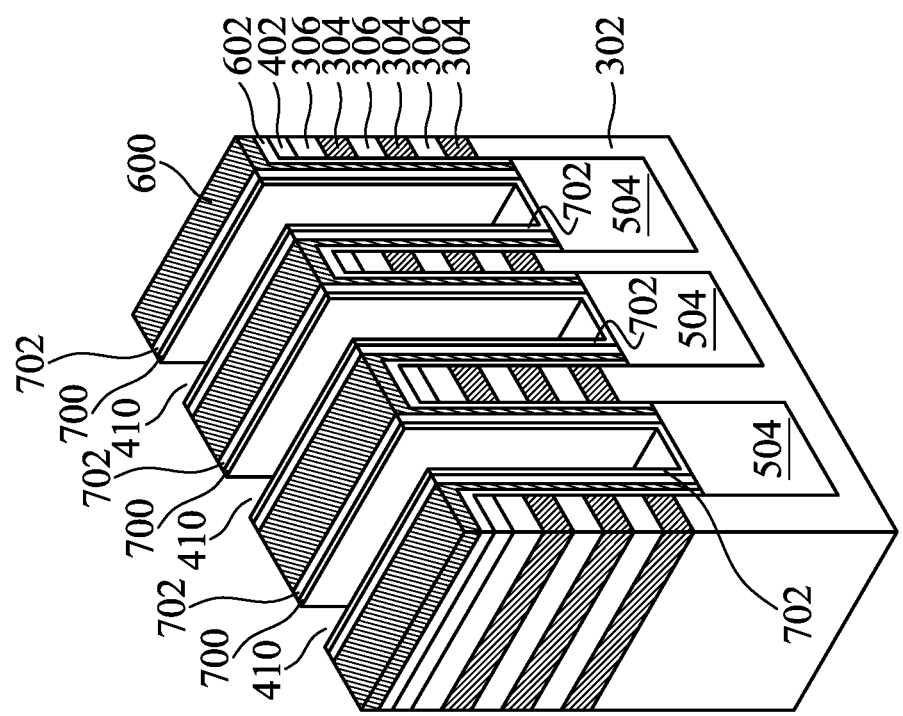

Corresponding to operation 210 of FIG. 2, FIG. 7 is a perspective view of the nanostructure transistor device 300 including a nitride-based dielectric layer 700 at one of the various stages of fabrication. As shown in FIG. 7, the nitride-based dielectric layer 700 can extend along the sidewalls of the cladding layer 600 and a top portion of the isolation structures 504 with a second oxide-based layer 702 optionally interposed therebetween.

After the cladding layer 600 is formed, the nitride-based dielectric layer 700 may be conformally deposited over the sidewalls of the cladding layer 600 and the top portion of the isolation structures 504. The nitride-based dielectric layer 700 may comprise SiCN or any other suitable material and may be formed by any suitable deposition process such as CVD (such as PECVD, HARP, or combinations thereof) process, ALD process, another applicable process, or a combination thereof. The nitride-based dielectric layer 700 may have a thickness in between about 1 and about 10 nanometers, inclusive (e.g., 1, 2, 3, 4, 5, 6, 7, 8, 9, or 10 nanometers).

In some embodiments, the second oxide-based layer 702 may be conformally formed over the cladding layer 600 prior to forming the nitride-based dielectric layer 700. The second oxide-based layer 702 can function as a protection layer for the cladding layer 600 while etching the nitride-based dielectric layer 700. The second oxide-based layer 702 may comprise a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD. In some embodiments, the second oxide-based layer 702 has a thickness in between about 1 and about 10 Angstroms, inclusive (e.g., 1, 2, 3, 4, 5, 6, 7, 8, 9, and 10 Angstroms). In some embodiments, the second oxide-based layer 702 is optional.

Figure 8A:
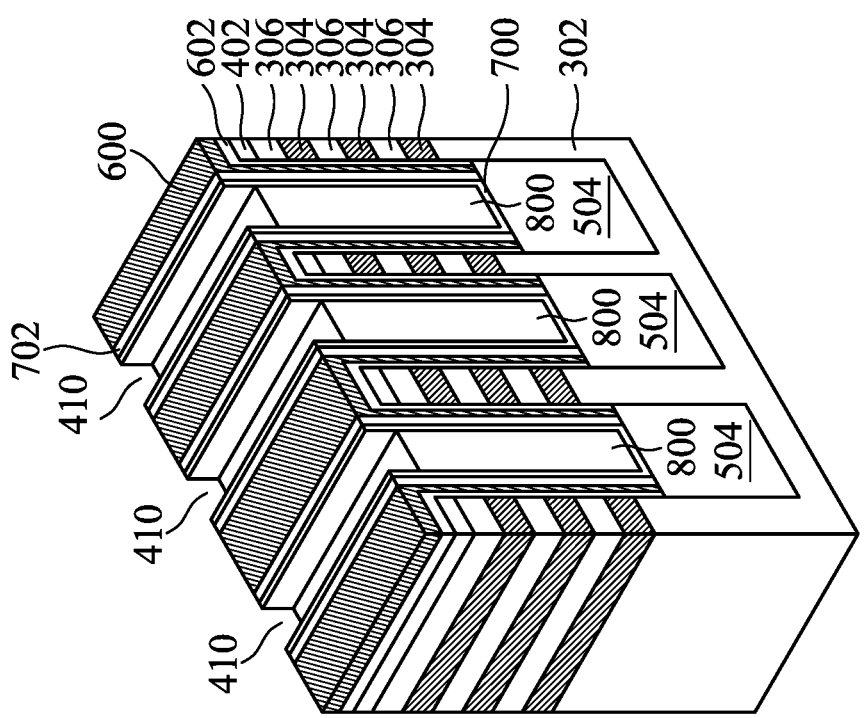
Figure 8B:
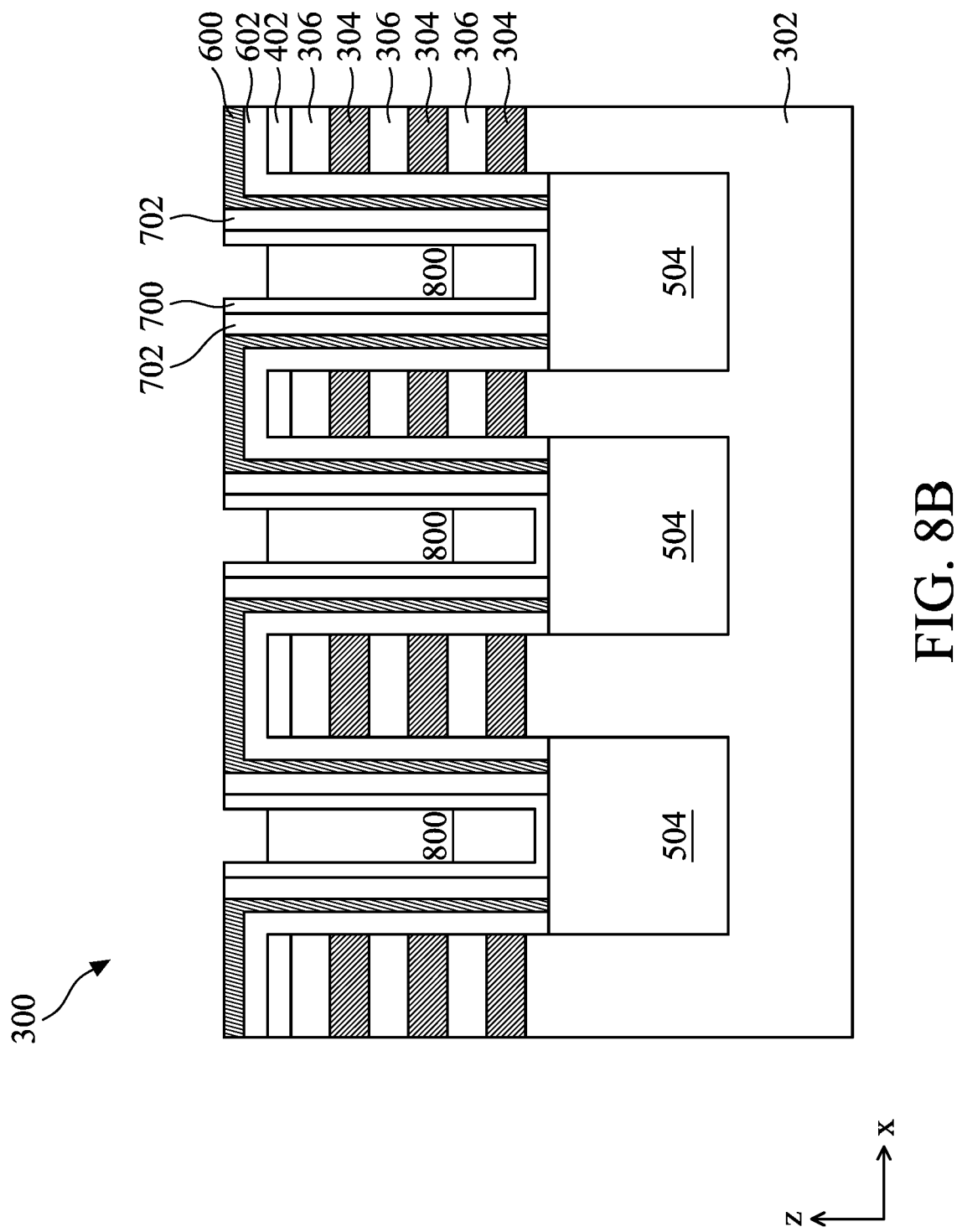
FIGS. 8B, 9B, 10B, 11B, 17B, and 18B illustrate cross-sectional views of the example nanostructure transistor corresponding to FIGS. 8A, 9A, 10A, 11A, 17A, and 18A, respectively, in accordance with some embodiments.

Corresponding to operations 212-214 of FIG. 2, FIGS. 8A-B are a perspective view and a cross-sectional view cut along the X-direction, respectively, of the nanostructure transistor device 300 including a third oxide-based layer 800 at one of the various stages of fabrication. As shown in FIGS. 8A-B, the third oxide-based layer 800 can extend along the bottom portion and the sidewalls of the nitride-based dielectric layer 700 and extends continuously in the Y-direction.

After the nitride-based dielectric layer 700 is formed, the third oxide-based layer 800 is formed in the trenches 410 at operation 212. The third oxide-based layer 800 may comprise a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD. The oxide-based layer 800 is first formed to be coplanar with top surfaces of the cladding layer 600. Respective top surfaces of the third oxide-based layer 800 may have a flat surface (as illustrated in FIGS. 8A-B), a convex surface, a concave surface (such as dishing), any other suitable surface, or combinations thereof. The top surfaces of the third oxide-based layer 800 may be formed flat, convex, and/or concave by an appropriate etch or a planarization process, such as a CMP process. The third oxide-based layer 800 may be then recessed using a suitable etching process, such as one that is selective to the material of the third oxide-based layer 800, at operation 214, as shown in FIGS. 8A-B.

Figure 9A:
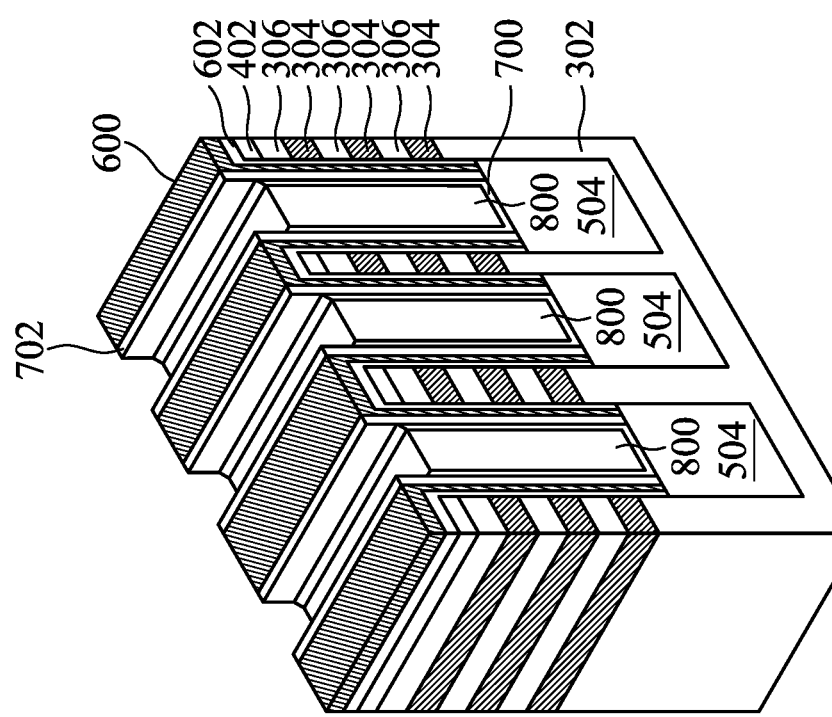
Figure 9A:
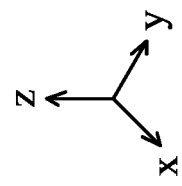
Figure 9B:
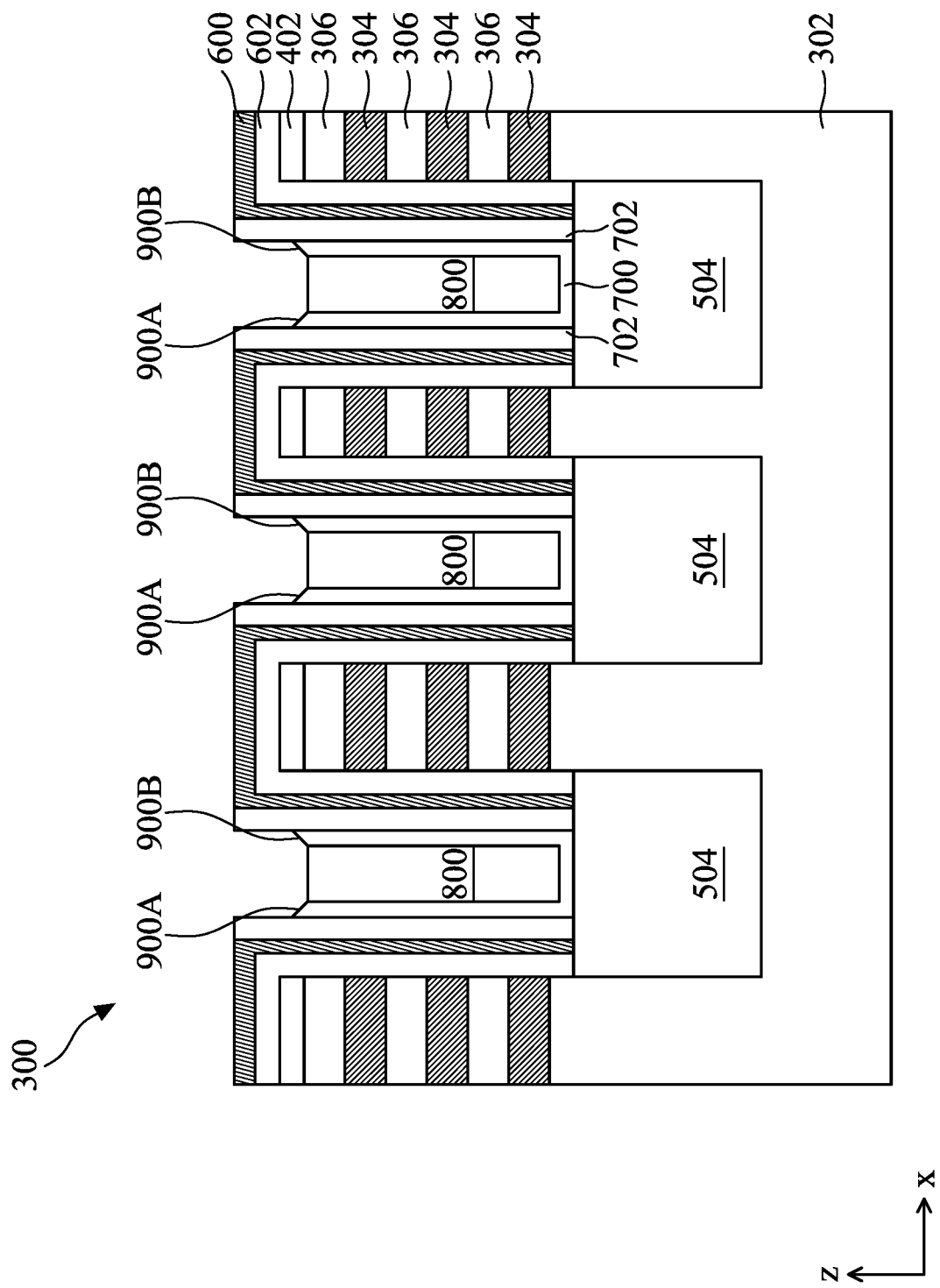

Corresponding to operation 216 of FIG. 2, FIGS. 9A-B are a perspective view and a cross-sectional view cut along the X-direction, respectively, of the nanostructure transistor device 300 in which the nitride-based dielectric layer 700 is etched at one of the various stages of fabrication. As shown in FIGS. 9A-B, the nitride-based dielectric layer 700 may be etched as having one or more tilted portions.

In some embodiments, the nitride-based dielectric layer 700 may be etched with a sulfuric peroxide mix (SPM) process or any other suitable process. In some embodiments, sulfuric acid and hydrogen peroxide are used in the etch at a temperature of about 170° C. Such a SPM process may minimize etching on the surrounding oxide-based layers 602, 702, and 800 and the cladding layer 600 while etching the nitride-based dielectric layer 700.

In some embodiments, the nitride-based dielectric layer 700 may be etched with a first tilted portion 900A and a second tilted portion 900B. The first tilted portion 900A and the second tilted portion 900B may be at an angle to a top surface of the third oxide-based layer 800 less than or equal to about 30 degrees (e.g., 1, 5, 10, 15, 20, 25, or 30 degrees). The first tilted portion 900A and the second tilted portion 900B may have the same angle or different angles. In some embodiments, the height in the Z-direction between a topmost portion of the nitride-based dielectric layer 700 and a bottommost portion may be less than or equal to about 2 nanometers (e.g., 0.1, 0.5, 1, 1.5, or 2 nanometers).

Figure 10A:
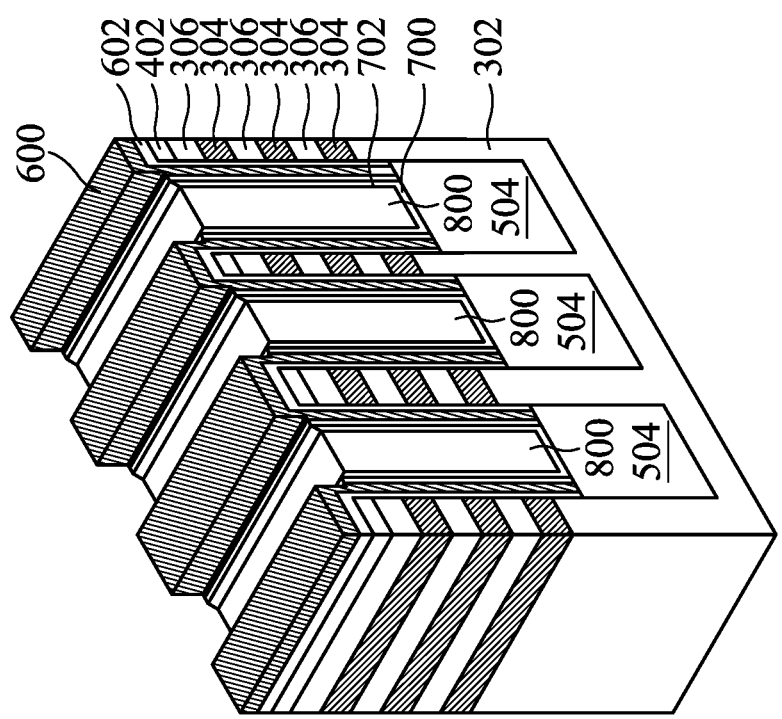
Figure 10B:
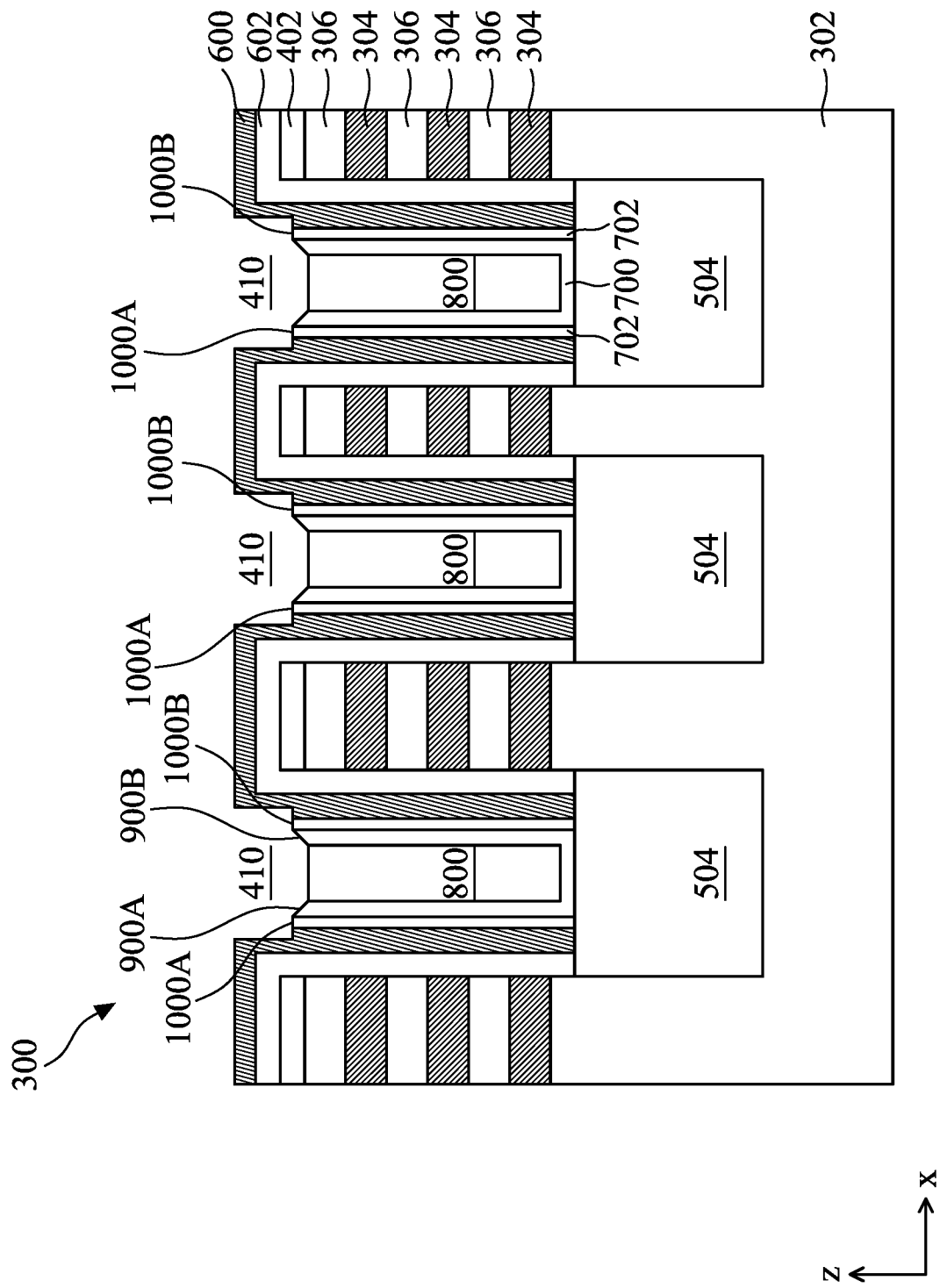

Corresponding to operation 218 of FIG. 2, FIGS. 10A-B are a perspective view and a cross-sectional view cut along the X-direction, respectively, of the nanostructure transistor device 300 in which the cladding layer 600 is etched at one of the various stages of fabrications. As shown in FIGS. 10A-B, the cladding layer 600 and the second oxide-based layer 702 (if present) may be etched with a flat plateau portion connected to the tilted portion of the nitride-based dielectric layer 700.

In some embodiments, the cladding layer 600 may be etched with a high temperature ammonium etch process or any other suitable process. In some embodiments, the etch may include ammonium and hydrogen peroxide at a temperature of about 60° C. In such embodiments, the process may etch the SiGe of the cladding layer 600 while minimizing the etch in the third-oxide based layer 800 and the nitride-based dielectric layer 700. In some embodiments, the second oxide-based layer 702 (if present) may also be etched with the cladding layer 600 due to the thinness of the second oxide-based layer 702 in comparison to the surrounding layers.

As such, the cladding layer 600 may be etched with a first plateau portion 1000A and a second plateau portion 1000B. In some embodiments, the first plateau portion 1000A and the second plateau portion may or may not be at the same height as each other in the Z-direction. The first plateau portion 1000A and the second plateau portion 1000B may have a flat surface, as shown in FIG. 10B. In some embodiments, the height in the Z-direction between the plateau portions 1000A and 1000B and the top surface of the third oxide-based layer 800 may be less than or equal to about 2 nanometers (e.g., 0.1, 0.5, 1, 1.5, or 2 nanometers). The first plateau portion 1000A may be connected to the first tilting portion 900A. The second plateau portion 1000B may be connected to the second tilting portion 900B.

Figure 11A:
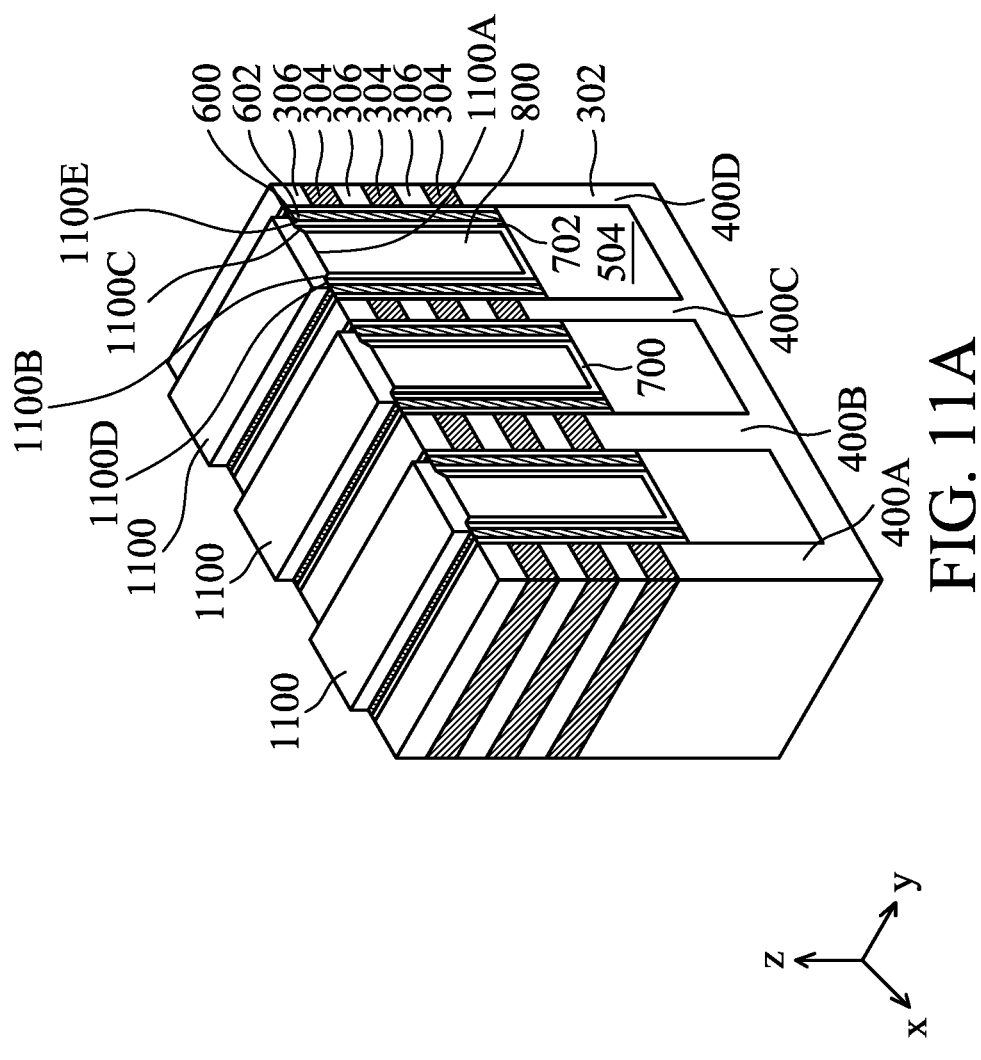
Figure 11B:
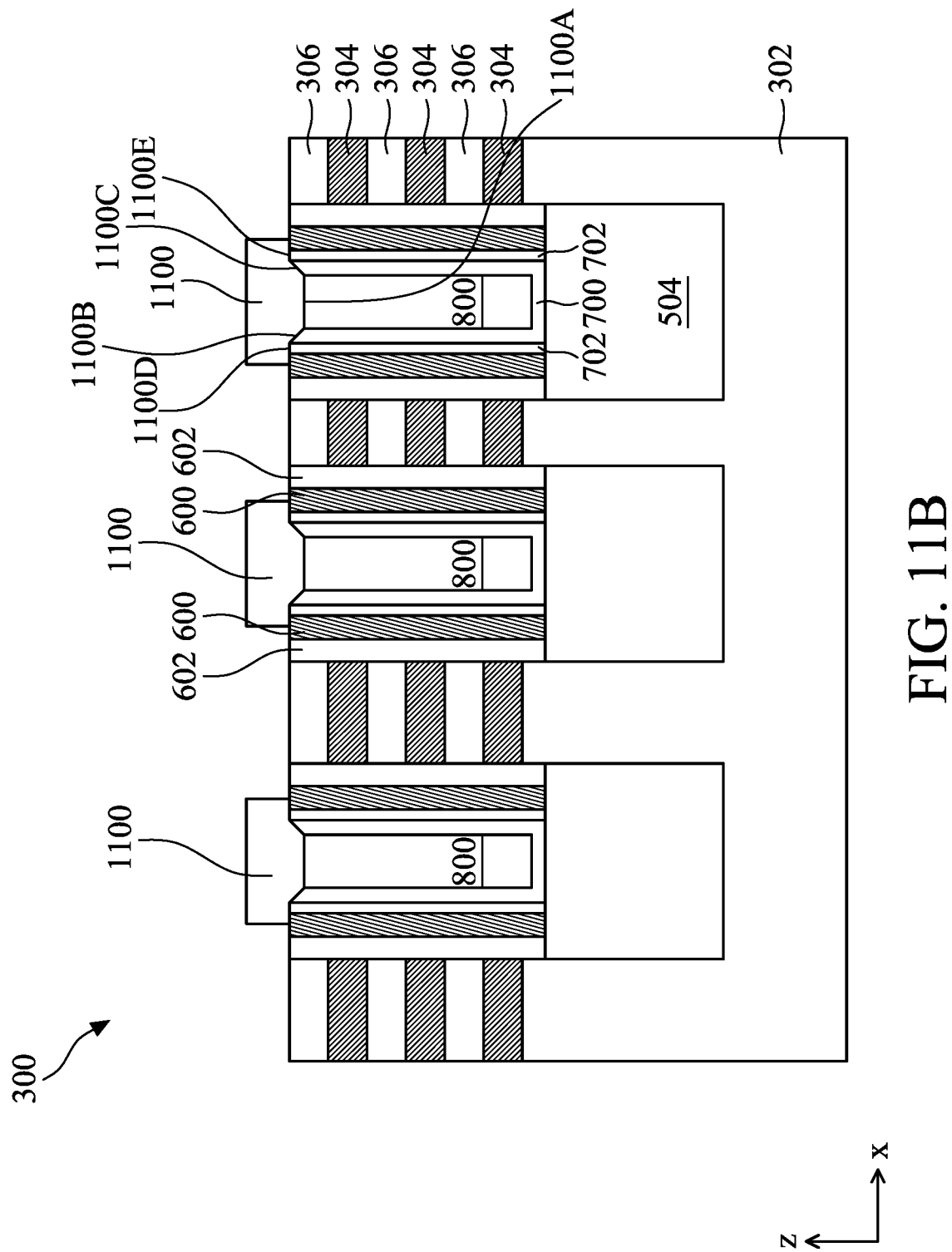

Corresponding to operation 220 of FIG. 2, FIGS. 11A-B are a perspective view and a cross-sectional view cut along the X-direction, respectively, of the nanostructure transistor device 300 including a high-k dielectric structure 1100 is formed at one of the various stages of fabrications. As shown in FIGS. 11A-B, the high-k dielectric structure 1100 extends along the Y-direction and has a bottom surface that includes a bottommost portion 1100A, a first tilted portion 1100B, a second tilted portion 1100C, a first plateau portion 1100D, and a second plateau portion 1100E.

In some embodiments, the high-k dielectric structure 1100 can be deposited in the trenches 410 (FIG. 10B) in the recess formed by the etched cladding layer 600, the etched second oxide-based layer 702 (if present), the etched nitride-based dielectric layer 700, and the third oxide-based layer 800. The high-k dielectric structure 1100 extends along the Y-direction. The high-k dielectric structure 1100 may include a dielectric material such as, for example, hafnium oxide (HfO$_2$), zirconium oxide (ZrO$_2$), hafnium aluminum oxide (HfAlOx), hafnium silicon oxide (HfSiOx), aluminum oxide (Al$_2$O$_3$), or combinations thereof. In some embodiments, a bottom surface of the high-k dielectric structure 1100 includes a bottommost portion 1100A disposed above the third oxide-based layer 800, as shown in FIG. 11B. The bottom surface further includes a first plateau portion 1100D and a second plateau portion 1100E disposed above the first cladding layer plateau portion 1000A (FIG. 10B) and the second cladding layer plateau portion 1000B (FIG. 10B), respectively, of the cladding layer 600 and the second oxide-based layer 702 (if present). The first plateau portion 1100D and the second plateau portion 1100E extend along the Y-direction. The first plateau portion 1100D and the second plateau portion 1100E have a height in the Z-direction elevated from the bottommost portion 1100A. The height difference in the Z-direction between the plateau portions 1100D and 1100E and the bottommost portion 1100A may be less than or equal to about 2 nanometers (e.g., 0.1, 0.5, 1, or 2 nanometers).

The bottom surface of the high-k dielectric structure 1100 may further include a first tilted portion 1100B and a second tilted portion 1100C disposed above the first dielectric layer tilted portion 900A (FIG. 9B) and the second dielectric layer tilted portion 900B (FIG. 9B), respectively. The first tilted portion 1100B and the second tilted portion 1100C may inherit the characteristics of the first dielectric layer tilted portion 900A and the second dielectric layer tilted portion 900B, respectively, including the angle of the tilted portions to the top surface of the third-oxide based layer 800. The first tilted portion 1100B and the second tilted portion 1100C may be at an angle to a top surface of the third oxide-based layer 800 less than or equal to about 30 degrees (e.g., 1, 5, 10, 15, 20, 25, or 30 degrees). The first tilted portion 1100B connects the bottommost portion 1100A to the first plateau portion 1100D. The second tilted portion 1100C connects the bottommost portion 1100A to the second plateau portion 1100E. Therefore, the nitride-based dielectric layer 700 includes at least a portion interposed between the bottommost portion 1100A and the first plateau portion 1100D. The nitride-based dielectric layer 700 may further include a portion interposed between the bottommost portion 1100A and the second plateau portion 1100E. The bottommost portion 1100A, the first plateau portion 1100D, the second plateau portion 1100E, the first tilted portion 1100B, and the second tilted portion 1100C form the bottom surface of the high-k dielectric structure 1100. In some nanostructure transistor devices, the height in the Z-direction between the topmost portion of the bottom surface (e.g., the top of the tilted portion) and the bottommost portion (sometimes referred to as a smiling difference) may be in between about 2 and about 10 nanometers, inclusive (e.g., 2, 3, 4, 5, 6, 7, 8, 9, or 10 nanometers) in comparison to less than or equal to two nanometers (e.g., 0.1, 0.5, 1, 1.5, or 2 nanometers) in the nanostructure transistor device 300. In some embodiments, the bottom portion of the high-k dielectric structure 1100 profile with a similar shape to a U, in comparison to the V-shape profile otherwise observed in some nanostructure transistor devices. In some embodiments, the bottom portion of the high-k dielectric structure 1100 has a profile with a bottommost portion, two tilted portions, and two plateau portions, in comparison to a V-shape profile observed in some nanostructure transistor devices.

The high-k dielectric structure 1100 may fill the entirety of the trench 410 (FIG. 10B). In some embodiments, the high-k dielectric structure 1100 may have a height in the Z-direction in between about 5 and about 20 nanometers, inclusive (e.g., 5, 10, 15, or 20 nanometers). In some embodiments, the high-k dielectric structure 1100 may have a width in the X-direction in between about 10 and about 30 nanometers, inclusive (e.g., 10, 15, 20, 25, or 30 nanometers). The width of the high-k dielectric structure 1100 in the X-direction is wider than the width of high-k dielectric structures typically observed in nanostructure transistor devices. In some embodiments, a planarization process such as a CMP process may be applied so that a top surface of the high-k dielectric structure 1100 is level with a top portion of the cladding layer 600.

In some embodiments, the top portion of the cladding layer 600, a top portion of the first oxide-based layer 602 (if present), and the hard mask 402 may then be removed with a planarization process such as a CMP process, exposing the topmost semiconductor layer 306, with vertical portions of the cladding layer 600, vertical portions of the first oxide-based layer 602 (if present), and the high-k dielectric structure 1100 remaining intact. Therefore, the high-k dielectric structure 1100 may extend above the topmost semiconductor layer 306 (or 304 in other embodiments) and is disposed in between the fin structures 400A-D.

Figure 12:
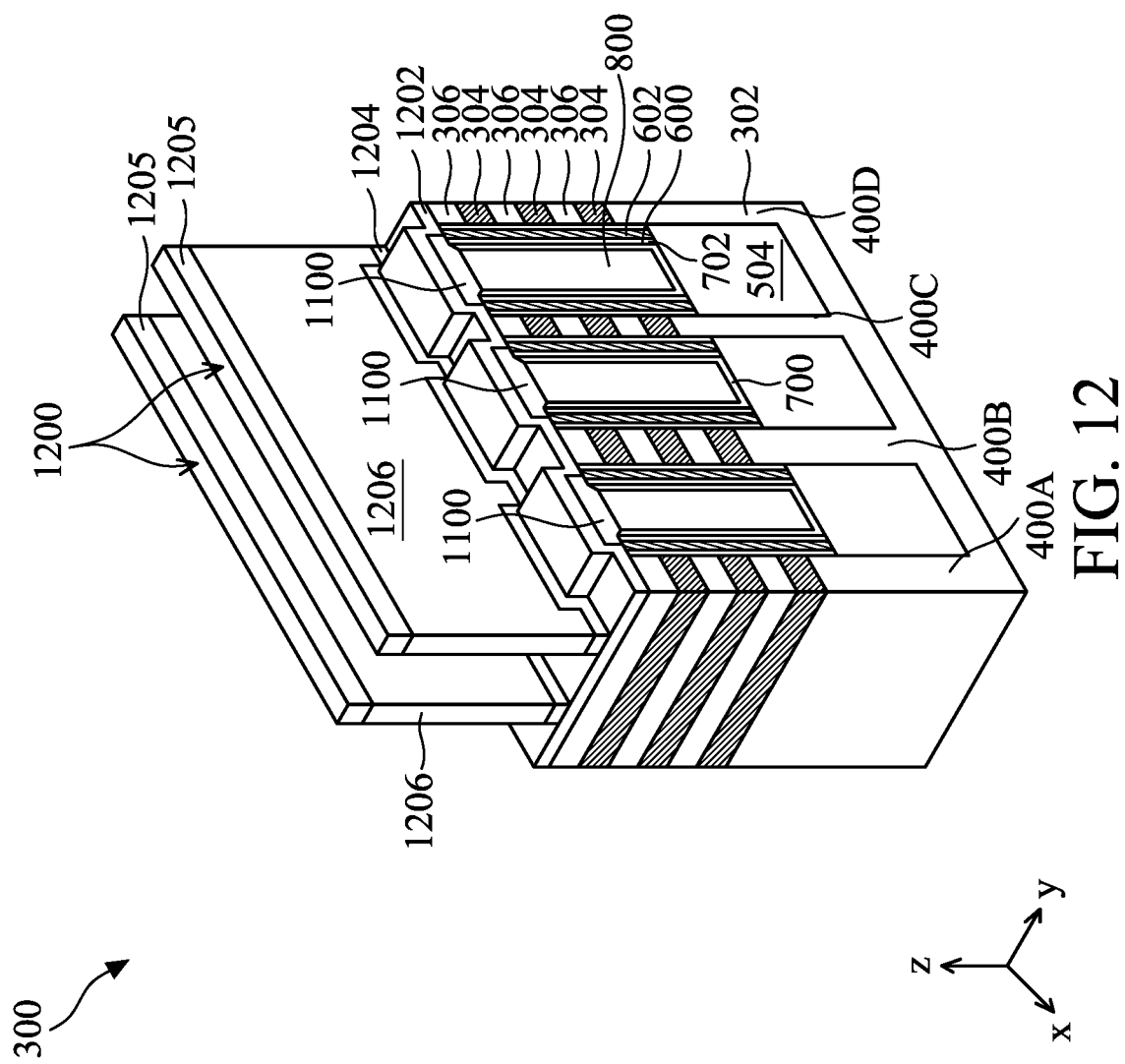

Corresponding to operation 222 of FIG. 2, FIG. 12 is a perspective view of the nanostructure transistor device 300 including one or more dummy gate structures 1200 at one of the various stages of fabrication. As shown in the illustrated example of FIG. 12, the dummy gate structures 1200, continuously extending along X-direction, can be formed over the workpiece. The dummy gate structure structures 1200 are placed where an active (e.g., metal) gate structure may later be formed, in various embodiments. Two dummy gate structures 1200 are shown in FIG. 12, but it is understood that any number of dummy gate structures 1200 may be formed in a nanostructure transistor device After the formation of the high-k dielectric structure 1100, an etching stop layer 1202 may be formed over a substantially top surface shared by the fin structures 400A-D and the high-k dielectric structure 1100. The etching stop layer 1202 may comprise a staircase formation over the high-k dielectric structure 1100 which is taller than the fin structures 400A-D. The etching stop layer 1202 may include silicon oxide or any other suitable material. The etching stop layer 1202 may be formed by a deposition process, such as CVD (such as PECVD, HARP, or combinations thereof) process, ALD process, another applicable process, or a combination thereof.

Next, the dummy gate structures 1200 are formed over the etching stop layer 1202. The dummy gate structures 1200 include a dummy gate dielectric 1204 and a dummy gate electrode 1206 in some embodiments. A mask 1205 may be formed over the dummy gate structure 1200. To form the dummy gate structure 1200, a dielectric layer is formed over the etch stop layer 1202. The dielectric layer may be, for example, silicon oxide, silicon nitride, silicon oxynitride, silicon carbide, silicon carbonitride, silicon oxycarbonitride, silicon oxycarbide, multilayers thereof, or any other suitable material and may be deposited or thermally grown.

A gate layer is then formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 1205. The pattern of the mask 1205 then may be transferred to the gate layer and the dielectric layer by a suitable etching technique to form the dummy gate electrode 1206 and the dummy gate dielectric 1204, respectively, to form the dummy gate structures 1200. The dummy gate structures 1200 each cover a respective central portion (e.g., a channel region) of each of the fin structures 400A-D and the high-k dielectric layers 1100.

Figure 13:
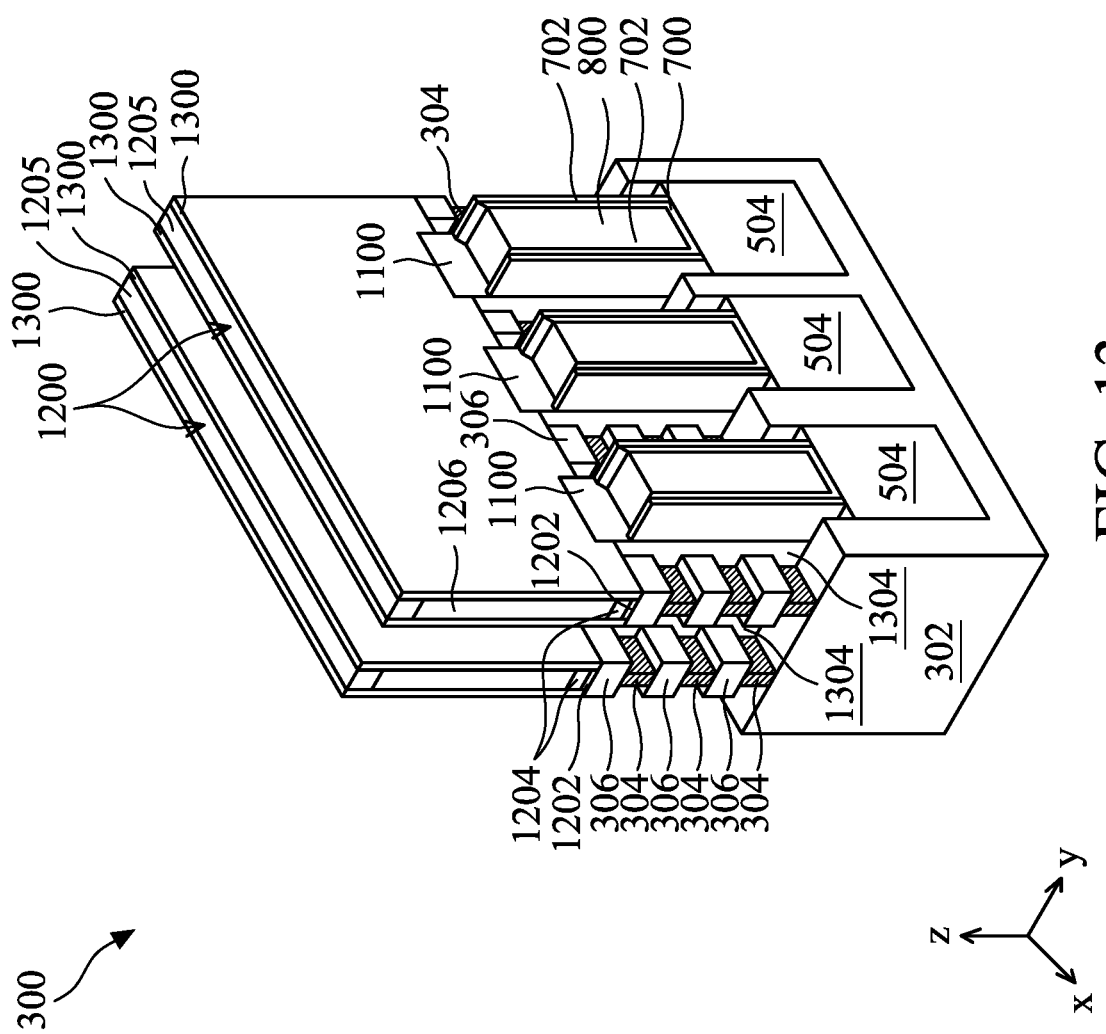

Corresponding to operation 224 of FIG. 2, FIG. 13 is a perspective view of the nanostructure transistor device 300 in which portions of the fin structures 400A-D, the cladding layer 600, and the first oxide-based layer 602 (if present) not overlaid by the dummy structures 1200 (and the corresponding gate spacers 1300) and end portions of the semiconductor layers 304 are removed at one of the various stages of fabrication.

After the formation of the dummy gate structures 1200, the gate spacers 1300 may be formed on opposing sidewalls (and extend along the X-direction) of each of the dummy gate structures 1200. The gate spacers 1300 may be low-k spacers and may be formed of a suitable dielectric material, such as silicon oxide, silicon oxycarbonitride, or the like. Any suitable deposition method, such as thermal oxidation, chemical vapor deposition (CVD), or the like, may be used to form the gate spacers 1300. In some embodiments, the gate spacers 1300 may have a thickness in the Y-direction in between about 1 nanometer and about 12 nanometers, inclusive (e.g., 1, 2, 5, 7, 10, 11, and 12 nanometers) or any other suitable thickness. The shapes and formation methods of the gate spacers 1300 as illustrated and described in FIG. 13 are merely non-limiting examples, and other shapes and formation methods are possible. These and other variations are fully intended to be included within the scope of the present disclosure.

Next, the portions of the fin structures 400A-D, portions of the cladding layer 600, and portions of the first oxide-based layer 602 (if present) (FIG. 12) that are not covered by the dummy gate structures 1200 and the gate spacers 1300 are removed by, for example, an anisotropic etching process using the dummy gate structures 1200 as an etching mask, although any other suitable etching process may also be used. In some embodiments, portions of the second oxide-based layer 702 (if present) are also removed by the anisotropic etching process using the dummy gate structures 1200 as an etching mask. Upon the portions of the fin structures 400A-D being removed, source/drain recesses 1304 are formed. The source/drain recesses 1304 can each expose respective "shortened" ends (along the Y direction) of each of the semiconductor layers 304 and 306.

Upon the ends of the semiconductor layers 304 and 306 being exposed (e.g., when forming the source/drain recesses 1304), respective end portions of each of the first semiconductor layers 304 and a portion of the cladding layer 600 (overlaid by the dummy gate structures 1200 and gate spacers 1300) may be concurrently removed, as the first semiconductor layers 304 and the cladding layer 600 include similar material. The end portions of the first semiconductor layers 304 and the portion of the cladding layer 600 can be removed (e.g., etched) using a "pull-back" process to pull the first semiconductor layers 304 and cladding layer 600 back by an initial pull-back distance such that the ends of the first semiconductor layers 304 terminate underneath (e.g., aligned with) the gate spacer 1300. It is understood that the pull-back distance (i.e., the extent to which each of the first semiconductor layers 304 is etched, or pulled-back) can be arbitrarily increased or decreased. In an example where the second semiconductor layers 306 include Si, and the first semiconductor layers 304 (together with the cladding layer 600) include $Si_{1-x}Ge_x$, the pull-back process may include a hydrogen chloride (HCL) gas isotropic etch process, which etches SiGe without attacking Si. As such, the second semiconductor layers 306 may remain substantially intact during this process.

Figure 14:
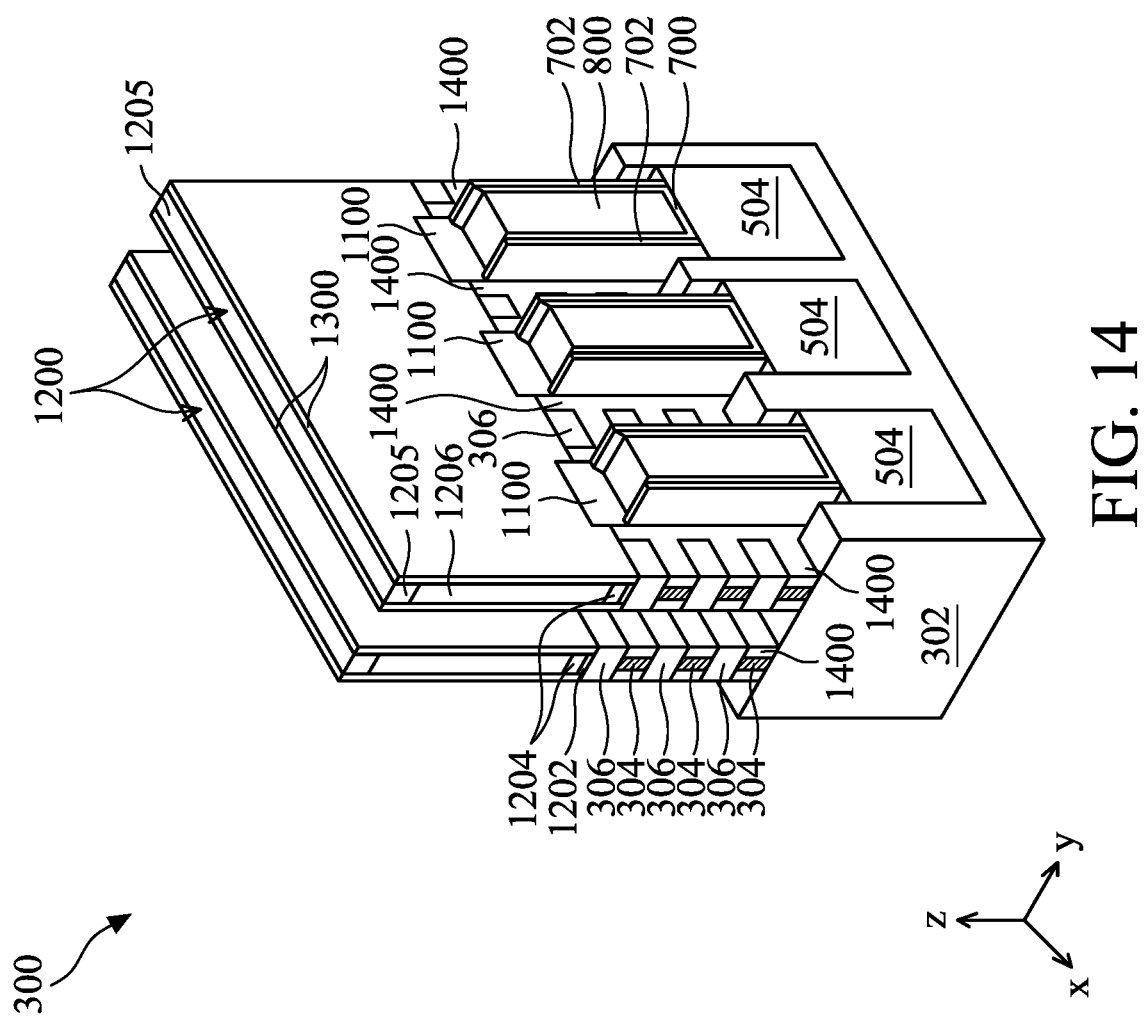

Corresponding to operation 226 of FIG. 2, FIG. 14 is a perspective view of the nanostructure transistor device 300 including inner spacers 1400 at one of the various stages of fabrication. As shown in FIG. 14, the inner spacers 1400 can be formed along the etched ends of each of the first semiconductor layers 304 and along respective ends (along the X-direction) of each of the semiconductor layers 304 and 306.

The inner spacers 1400 can be formed conformally by chemical vapor deposition (CVD), or by monolayer doping (MLD) of nitride followed by spacer RIE. The inner spacers 1400 can be deposited using, e.g., a conformal deposition process and subsequent isotropic or anisotropic etch back to remove excess spacer material on the sidewalls of the fin structures 400A-D (FIG. 12) and on a surface of the semiconductor substrate 302. A material of the inner spacers 1400 can be formed from the same or different material as the gate spacer 1300 (e.g., silicon nitride). For example, the inner spacers 1400 can be formed of silicon nitride, silicoboron carbonitride, silicon carbonitride, silicon carbon oxynitride, or any other type of dielectric material (e.g., a dielectric material having a dielectric constant less than about 5) appropriate to the role of forming an insulating gate sidewall spacers of transistors.

Figure 15:
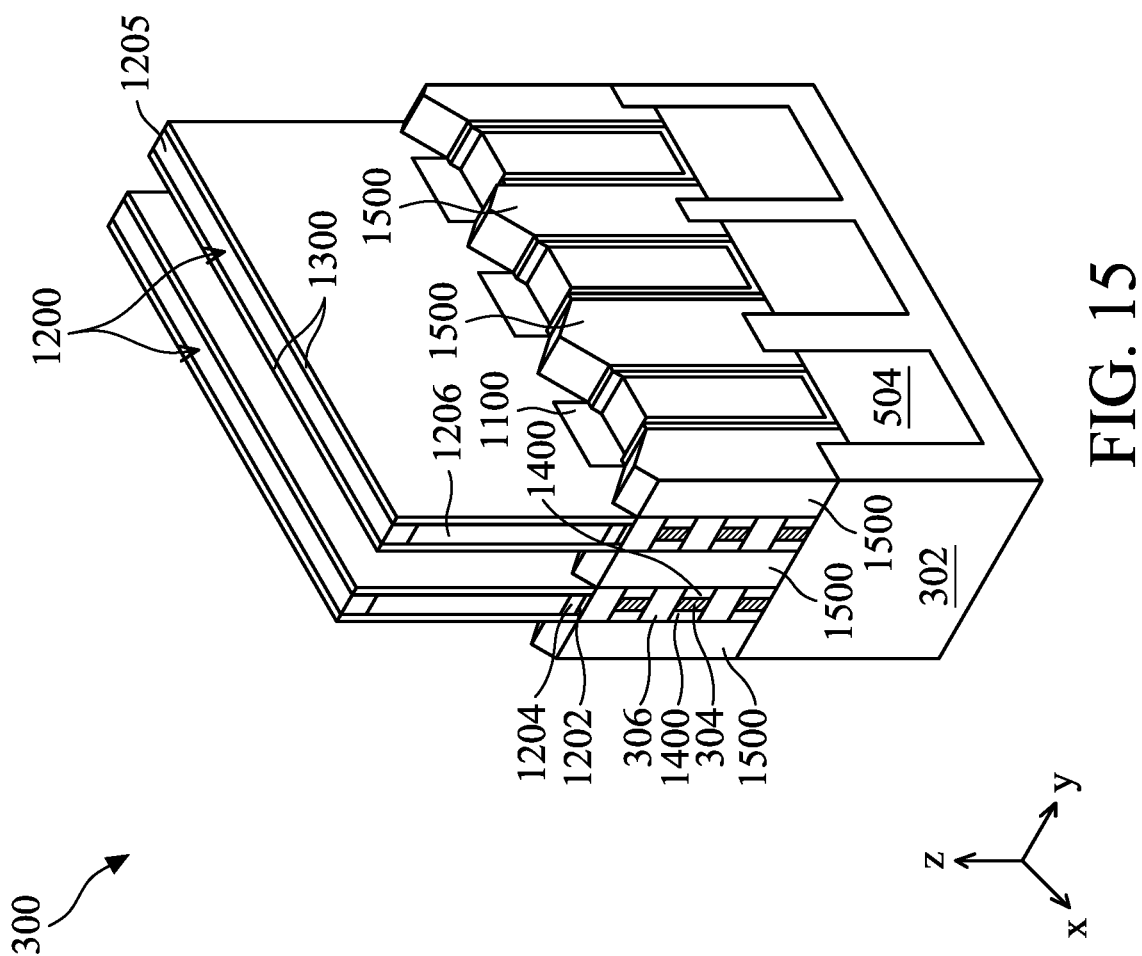

Corresponding to operation 226 of FIG. 2, FIG. 15 is a perspective view of the nanostructure transistor device 300 including epitaxial structures 1500 at one of the various stages of fabrication. As shown in the illustrated example of FIG. 15, the epitaxial structures 1500 are formed in the source/drain recesses 1304, respectively. The epitaxial structures 1500 are coupled to respective ends (along the X-direction) of the fin structures 400A-D (FIG. 12), e.g., the respective "shortened" or "etched" ends of each of the second semiconductor layers 306.

The epitaxial structures 1500 may each include silicon germanium (SiGe), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), any other suitable material, or combinations thereof. The epitaxial structures 1500 may be formed using an epitaxial layer growth process on exposed ends of each of the second semiconductor layers 306. For example, the growth process can include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epitaxial processes. In some embodiments, a bottom surface of the epitaxial structures 1500 may be leveled with the top surface of the isolation structure 504. In other embodiments, the bottom surface of the epitaxial structures 1500 may be lower than the top surface of the isolation structure 504.

In-situ doping (ISD) may be applied to form doped epitaxial structures 1500, thereby creating the junctions for the nanostructure transistor device 300. For example, when the nanostructure transistor device 300 is configured in n-type, the epitaxial structures 1500 can be doped by implanting n-type dopants, e.g., arsenic (As), phosphorous (P), etc., into them. When the nanostructure transistor device 300 is configured in p-type, the epitaxial structures 1500 can be doped by implanting p-type dopants, e.g., boron (B), etc., into them.

In some other embodiments, two adjacent ones of the epitaxial structures 1500 may merge. With such embodiments, the dielectric layers (e.g., 700, 702, 800) between the corresponding fin structures 400, from which the merged epitaxial structures 1500 are formed, may not be formed in the previous fabrication stages. Accordingly, there may not be a high-k dielectric structure 1100 formed between these adjacent fin structures 400. For example, at the fabrication stages (e.g., corresponding to operations 210-214 of FIG. 2), the layers 700, 702, and 800 may not be formed between two adjacent ones of the fin structures 400 (and in turn no high-k dielectric structure 1100 formed therebetween), which can allow epitaxial structures 1500 respectively grown from these adjacent fin structures 400 to merge with each other.

Figure 16:
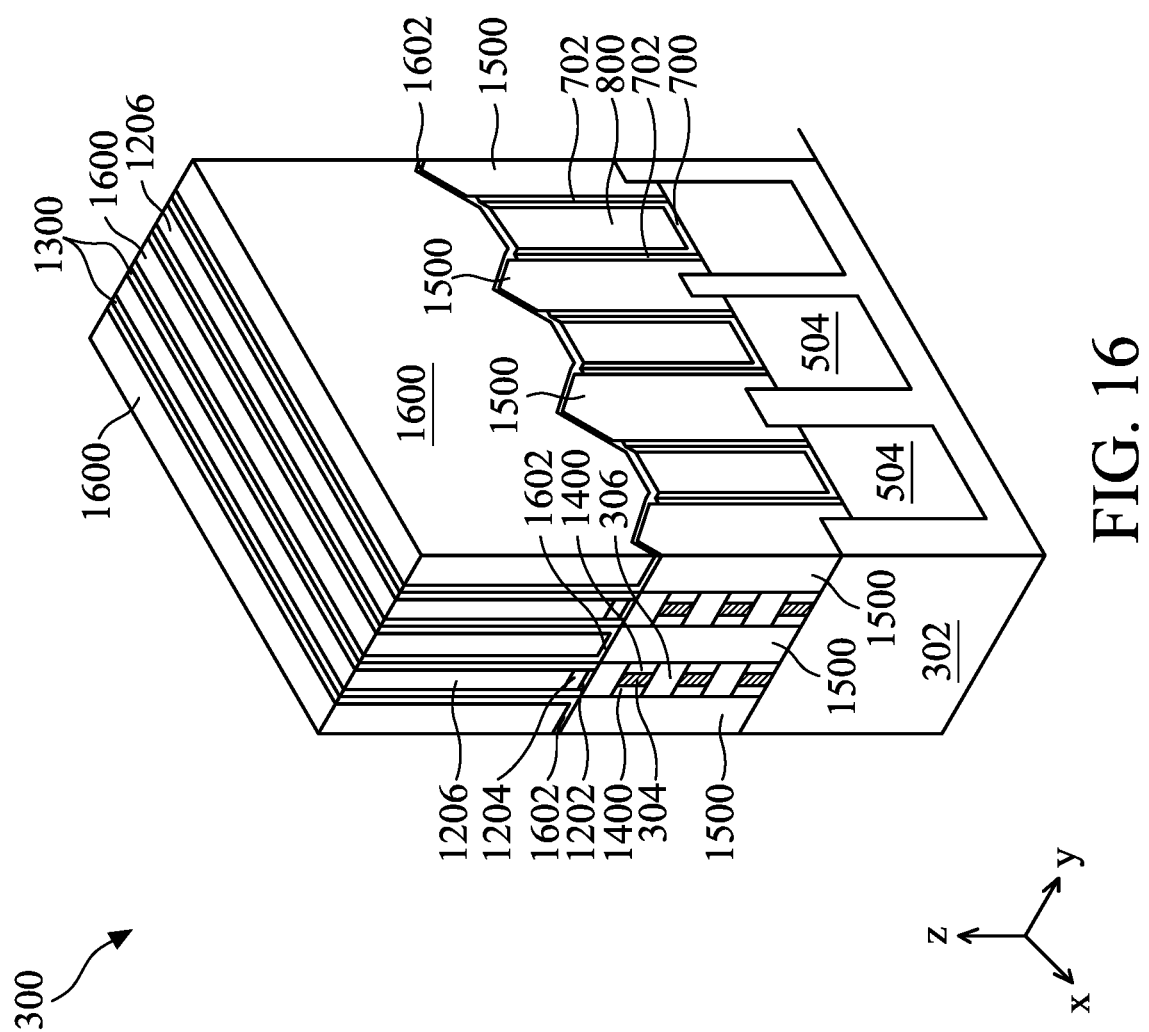

Corresponding to operation 230 of FIG. 2, FIG. 16 is a perspective view of the nanostructure transistor device 300 including an interlayer dielectric (ILD) 1600 at one of the various stages of fabrication. As shown in the illustrated example of FIG. 16, the ILD 1600 is formed on opposing sides (along the X-direction) of each of the dummy gate structures 1200 to overlay the epitaxial structures 1500 and the third oxide-based layer 800, with a contact etch stop layer 1602 disposed therebetween.

The contact etch stop layer 1602 may be first formed over the epitaxial structures 1500, the third oxide-based layer 800, and the dummy gate structures 1200. The contact etch stop layer 1602 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like. The contact etch stop layer 1602 may have a thickness in a range in between about 5 Angstroms and about 50 Angstroms, inclusive (e.g., 5, 15, 25, 35, 45, and 50 Angstroms) or any other suitable thickness.

Next, the ILD 1600 is formed over the contact etch stop layer 1602. The ILD 1600 extends along the X-direction. In some embodiments, the ILD 1600 is formed of a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD. Next, a planarization process, such as a CMP process, may be performed to achieve a level top surface for the ILD 1600. The CMP may also remove the mask 1205 and portions of the contact etch stop layer 1602 disposed over the mask 1205. After the planarization process, the top surface of the ILD 1600 is level with a top surface of the dummy gate structures 1200, in some embodiments.

Figure 17A:
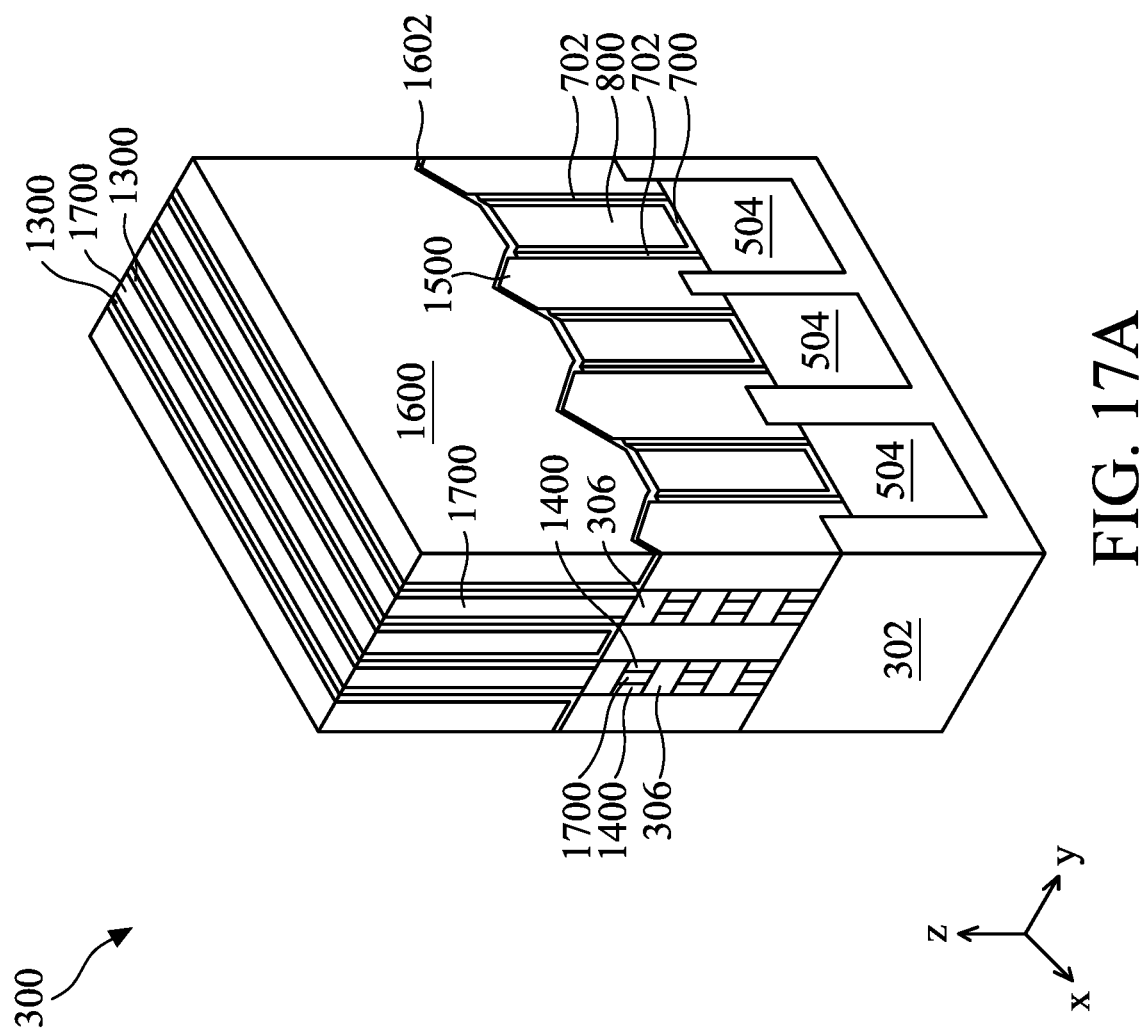
Figure 17B:
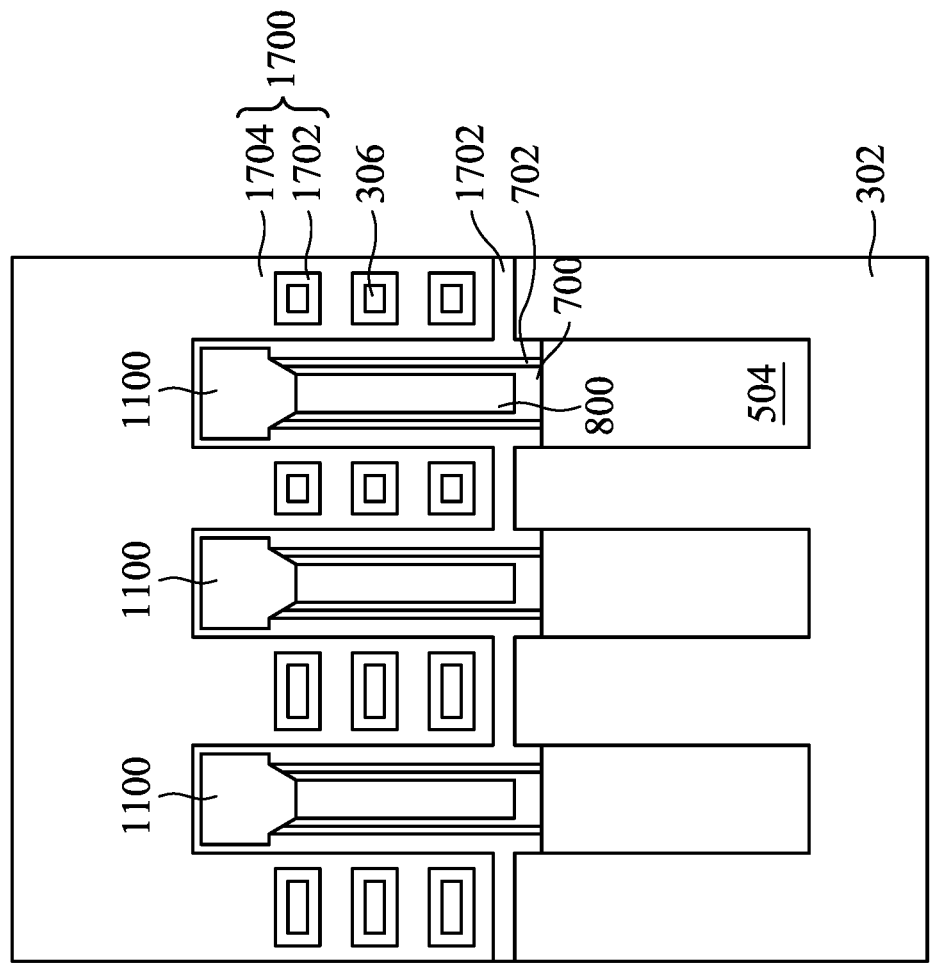

Corresponding to operation 232 of FIG. 2, FIGS. 17A-B are a perspective view and a cross-sectional view cut along the X-direction of the nanostructure transistor device 300 in which the active gates structures 1700 (sometimes referred to as metal gate structures) are formed at one of the various stages of fabrication.

Subsequently to forming the ILD 1600 and exposing the dummy gate structures 1200 (FIG. 16), the dummy gate structures 1200, the etch stop layer 1202, and the first semiconductor layers 304 are sequentially removed. The dummy gate structures 1200 and the etch stop layer 1202 can be removed by an etching process, e.g., RIE, chemical oxide removal (COR), or any other suitable process. After removing the dummy gate structures 1200 and the etch stop layer 1202, the top surface of each of the fin structures 400A-D (e.g., the top surface of the topmost semiconductor layers 306) is exposed. In addition to the top surface, sidewalls of each fin structure 400 (facing the Y-direction) may be exposed. Next, the first semiconductor layers 304 are removed from each of the fin structures 400 by applying a selective etch (e.g., a hydrochloric acid (HCl)), while leaving the second semiconductor layers 306 substantially intact. After the removal of the first semiconductor layers 304, respective bottom surface and top surface of each of the second semiconductor layers 306 may be exposed.

Then, at operation 232, one or more active gate structures 1700 (sometimes referred to as gate structures) are formed. Each of the active gate structures includes a gate dielectric and a gate metal, in some embodiments. For example, in FIG. 17B, each of the active gate structures 1700 includes a gate dielectric 1702 and a gate metal 1704.

As shown in FIG. 17A, the active gate structures 1700 may be disposed in the exposed cavities left by the dummy gate structures 1200 and the first semiconductor layers 304. In some embodiments, the active gate structures 1700 disposed above the second semiconductor layer 306 may have a height in the Z-direction in a range in between about 5 nanometers to 30 nanometers, inclusive (e.g., 5, 7, 10, 15, 20, 25, and 30 nanometers). In some embodiments, the active gate structures 1700 disposed above the second semiconductor layers 306 may have a width in the Y-direction in a range in between about 9 and about 100 nanometers, inclusive (e.g., 9, 10, 15, 20, 30, 40, 50, 60, 70, 80, 90, and 100 nanometers).

In some embodiments, a subset of the second semiconductor layers 306 that are vertically arranged from one another is collectively configured as the channel structure of a nanostructure FET device. In some embodiments, multiple such subsets can collectively be configured as the channel structure of a nanostructure FET device. The plurality of second semiconductor layers 306 comprises nanostructures (e.g., nanosheets, nanowires, etc.) and results in a plurality of nanostructures vertically spaced apart from one another. At least one end of each of the nanostructures is coupled to the epitaxial structures 1500. In such embodiments, the gate structures 1700 formed from the gate dielectric and the gate metal wrap around each of the plurality of nanostructures. In some embodiments, the high-k dielectric structure 1100 may be disposed between separate channel structures, as shown in FIG. 17B.

As shown in FIG. 17B, the gate dielectric 1702 wraps around each of the second semiconductor layers 306, e.g., the top and bottom surfaces and sidewalls perpendicular to the Y direction). The gate dielectric 1702 may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric 1702 may include a stack of multiple high-k dielectric materials. The gate dielectric 1702 can be deposited using any suitable method, including, for example, molecular beam deposition (MBD), atomic layer deposition (ALD), PECVD, and the like. In some embodiments, the gate dielectric 1702 may optionally include a substantially thin oxide (e.g., $SiO_x$) layer.

The gate metal 1704 can wrap around each of the second semiconductor layers 306 with the gate dielectric 1702 disposed therebetween. Therefore, the active gate structures 1700 straddle the channel structures. Specifically, the gate metal 1704 can include a number of gate metal sections abutted to each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin together to wrap around a corresponding one of the second semiconductor layers 306, with the gate dielectric 1702 disposed therebetween.

The gate metal 1704 may include a stack of multiple metal materials. For example, the gate metal 1704 may be a p-type work function layer, an n-type work function layer, multi-layers thereof, any other suitable material, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

As shown in FIG. 17B, the high-k dielectric structures 1100 are disposed in between and isolate the gate structures 1700 along the X-direction. The high-k dielectric structures 1100 comprise a first portion extending into the gate structures along the X-direction. Each high-k dielectric structure 1100 has a lengthwise direction extending along the Y-direction across the epitaxial structures 1500 and the second semiconductor layers 306 containing nanostructures. The high-k dielectric structures comprise a second portion (sometimes referred to as the bottom surface) vertically lower than the first portion.

Figure 18A:
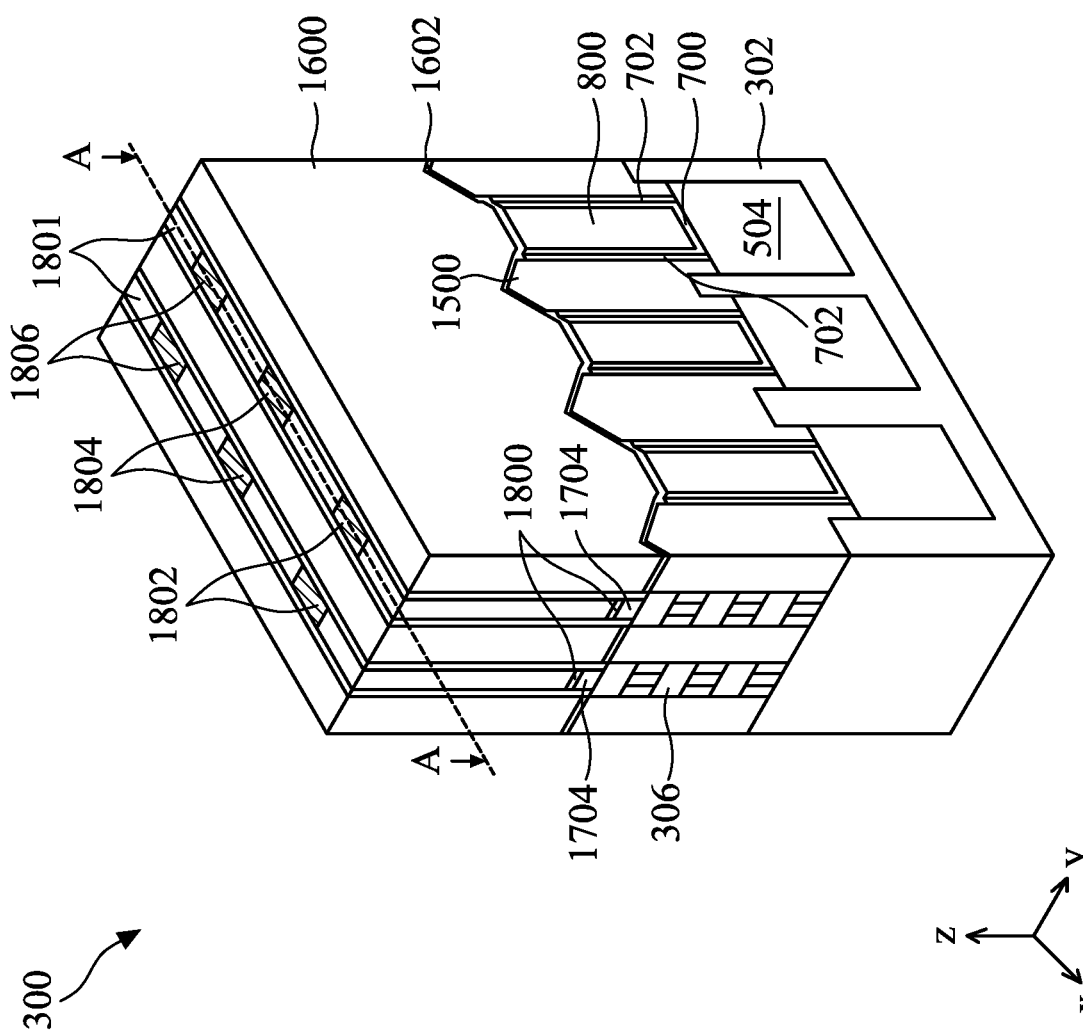
Figure 18B:
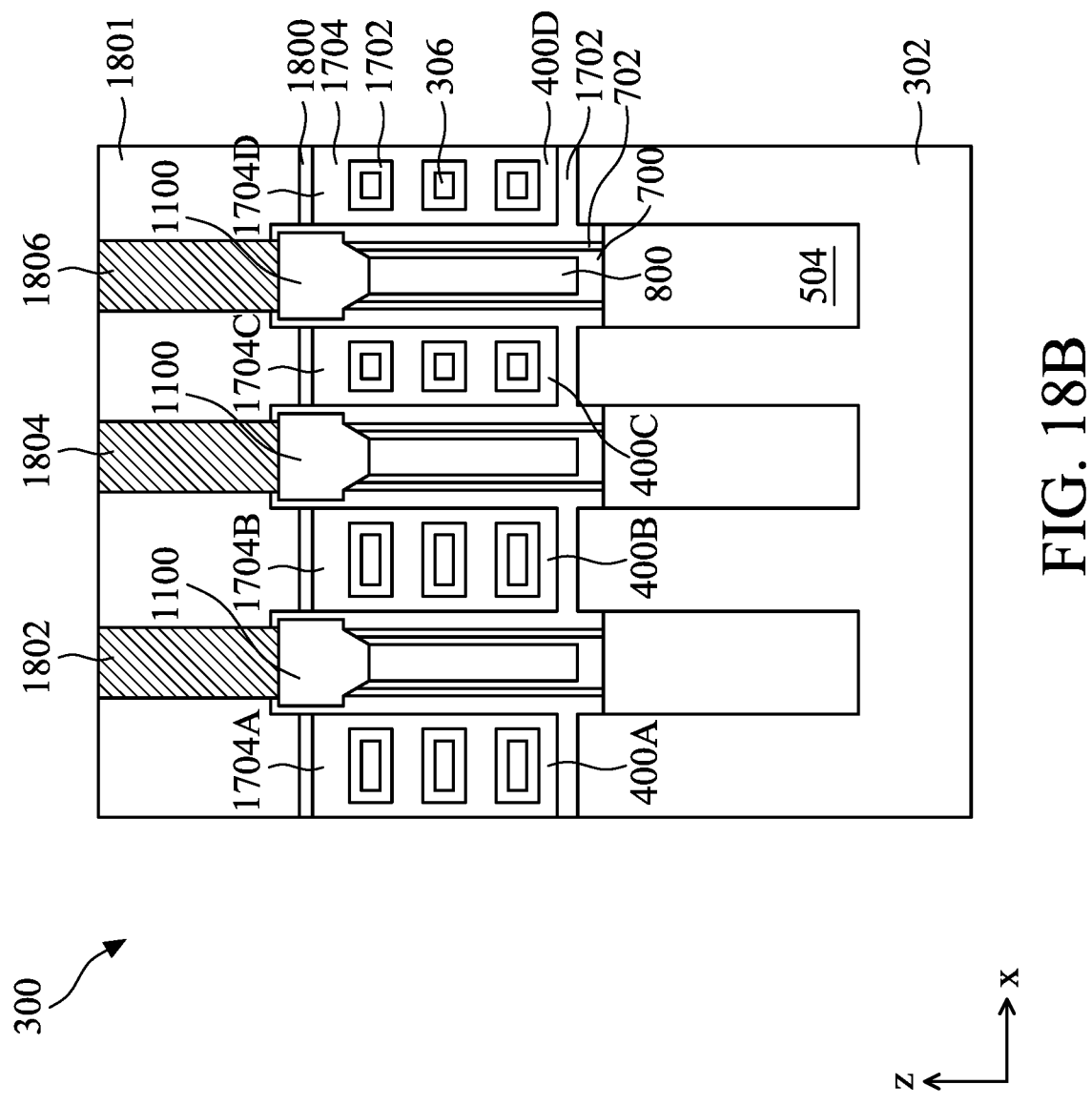

Corresponding to operation 234 of FIG. 2, FIGS. 18A-B are a perspective view and a cross-sectional view along the X-direction of the nanostructure transistor device 300 including gate cut structures 1802, 1804, and 1806 at one of the various stages of fabrication. For clarity of illustration, FIG. 18B is a corresponding cross-sectional view of the nanostructure transistor device 300 that is cut along cross-section A-A (e.g., along a longitudinal direction of one of the active gate structures 1700) indicated in FIG. 18A.

Upon forming the active gate structures 1700, an upper portion of the gate metal 1704 may be removed. In some embodiments, the upper portion of the gate metal 1704 is removed by a planarizing process, e.g., a CMP process, until the patterned portions of the high-k dielectric structure 1100 (as illustrated in FIG. 18B) are again exposed. Next, the remaining portion of the gate metal 1704 is etched back by an etching process, therefore causing the patterned portions of the high-k dielectric structure 1100 to protrude above a top surface of the gate metal 1704. The patterned portions of the high-k dielectric structure 1100 can cut the gate metal 1704, which causes a number of gate metal segments 1704A, 1704B, 1704C, and 1704D to be formed.

Next, a conductive layer 1800 is selectively formed over the gate metal 1704, and a dielectric layer 1801 is formed over the conductive layer 1800. The conductive layer 1800 is configured to reduce the resistance of the gate metal 1704. In some embodiments, the conductive layer 1800 may include tungsten (W). The conductive layer 1800 may be selectively formed over the gate metal 1704, but not formed over the patterned portions of the high-k dielectric structure 1100. In some embodiments, the dielectric layer 1801 may include silicon nitride, silicon oxynitride (SiON), silicon carbide (SiC), another applicable insulating material, or combinations thereof.

In some embodiments, prior to the formation of the conductive layer 1800, a surface treatment process may be performed on the top surface of the gate metal 1704 (e.g., the gate metal segments 1704A-D) to generate some hydrogen radicals, and then a deposition process with a precursor is performed on the treated top surface of the gate metal 1704 to selectively form the conductive layer 1800 on the gate metal segments 1704A-D. The surface treatment process can include using hydrogen ($H_2$) gas to generate hydrogen radicals. The precursor, which can include tungsten (W)-containing material such as, for example, tungsten hexafluoride ($WF_6$) or tungsten hexachloride ($WCl_6$), can react with the hydrogen radicals to selectively form the conductive layer 1800.

Next, the gate cut structures 1802, 1804, and 1806 can be formed in the dielectric layer 1801. In some embodiments, the gate cut structures 1802, 1804, and 1806 may include silicon nitride, silicon oxynitride (SiON), silicon carbide (SiC), another applicable insulating material, or combinations thereof. After the dielectric layer 1801 is deposited, it may be patterned to form trenches extending therethrough and exposing the patterned portions of the high-k dielectric structure 1100. The gate cut features 1802, 1804, and 1806 are then formed by filling the trenches with at least one of the forgoing insulating materials. The gate cut features 1802, 1804, and 1806 can be used to further electrically isolate the gate metal segments 1704A-D. For example, the gate cut feature 1802 can electrically isolate the gate metal segments 1704A and 1704B; the gate cut feature 1804 can electrically isolate the gate metal segments 1704B and 1704C; and the gate cut features 1806 can electrically isolate the gate metal segments 1704C and 1704D. In some other embodiments, the conductive layer 1800 may globally be formed over the workpiece, e.g., overlaying both the gate metal 1704 and the patterned portions of the high-k dielectric structure 1100. As such, after depositing the dielectric layer 1801 over the conductive layer 1800, the above-mentioned trenches may be formed to extend through both of the dielectric layer 1801 and the conductive layer 1800, thereby causing the gate cut features to electrically isolate the gate metal segments 1704A-D.

In accordance with various embodiments, the gate metal segments 1704A-D may function as respective gates of a number of transistors. As a non-limiting example, the gate metal segment 1704A may function as the gate of a first nanostructure transistor that has the second semiconductor layers 306 of the fin structures 400A as its conduction channel; the gate metal segment 1704B may function as the gate of a second nanostructure transistor that has the second semiconductor layers 306 of the fin structures 400B as its conduction channel; the gate metal segment 1704C may function as the gate of a third nanostructure transistor that has the second semiconductor layers 306 of the fin structures 400C as its conduction channel; and gate metal segment 1704D may function as the gate of a fourth nanostructure transistor that has the second semiconductor layers 306 of the fin structures 400D as its conduction channel. Further, the epitaxial structures 1500 formed on respective ends of each of the conduction channels may function as respective source and drain of the corresponding nanostructure transistor.

In some other embodiments, two or more adjacent gate metal segments may merge as one single gate metal (segment) to wrap around two or more fin structures. In such a case, these two or more merged gate metal segments can function as the gate of a nanostructure transistor that has those two or more fin structures as its conduction channel (which is sometimes referred to as a multi-channel transistor). To fabricate such a multi-channel transistor while keeping some other transistors having a single channel, at least a majority portion of the high-k dielectric structure 1100 between those adjacent fin structures 400 may be selectively removed prior to depositing the gate dielectric 1702 and gate metal 1704. Alternatively stated, at least a majority portion of the high-k dielectric structure 1100 between two adjacent fin structures 400 is replaced with the gate metal 1704. As such, while polishing the upper portion of the gate metal 1704, in addition to the gate metal segments that respectively wrap around the fin structures 400, a portion of the gate metal 1704 can remain as connecting two or more of the gate metal segments, which allows two of more gate metal segments to merge with each other and form the gate of a multi-channel transistor. Such a portion of the gate metal 1704 can be disposed directly above the bottom surface of the high-k dielectric structure 1100.

Alternatively in such embodiments, the whole high-k dielectric structure 1100 formed between the adjacent fin structures 400 (of the multi-channel transistor) may be removed prior to depositing the gate dielectric 1702 and gate metal 1704, while some other high-k dielectric structure(s) 1100 may remain between the adjacent fin structures 400 (of respective channel transistors). As such, while polishing the upper portion of the gate metal 1704, in addition to the gate metal segments that respectively wrap around the fin structures 400, a portion of the gate metal 1704 can remain as connecting two or more of the gate metal segments, which allows two of more gate metal segments to merge with each other and form the gate of a multi-channel transistor. Accordingly, such a portion of the gate metal 1704 can inherit the (e.g., U-shaped) profile of the bottom surface of the high-k dielectric structure 1100 (which is absent in such an embodiment).

Although the above-described operations of the method 200 are directed to forming the nanostructure transistor device 300 in either an n-type or p-type, it should be appreciated that the method 200 is not limiting thereto. In other words, the method 200 can be used to form a nanostructure transistor device having both n-type and p-type nanostructure transistors.

For example, the first region of a semiconductor substrate may be defined to form a number of n-type nanostructure transistors, and the second region of the semiconductor substrate may be defined to form a number of p-type nanostructure transistors by forming fin structures (e.g., 400) having different conduction types in the respective first and second regions. Prior to forming the fin structures, a p-type well can be formed in the first region; and an n-type well can be formed in the second region. Next, a first fin structure including alternating first and second semiconductor layers in p-type can be formed from the p-type well; and a second fin structure including alternating first and second semiconductor layers in n-type can be formed from the n-type well. In some embodiments, a fin structure formed from the p-type well will have a width less than a fin structure formed from n-type well. For example, the fin structures 400A and 400B, as shown in FIG. 18A-B, may be formed from n-type wells. The fin structures 400C and 400D may be formed from p-type wells. The fin structures 400C and 400D may have a width in the X-direction that is less than a width of the fin structures 400A and 400B. By performing the rest of operations of the method 200 with certain operations respectively performed in the first and second regions, the n-type nanostructure transistors and p-type nanostructure transistors can be formed in the first and second regions, respectively. For example, when forming the epitaxial structures for the n-type and p-type nanostructure transistors (e.g., operation 228 of FIG. 2), the corresponding operations may be performed in the first and second regions, respectively.

In one aspect of the present disclosure, a semiconductor device is disclosed. The semiconductor device includes a first channel structure extending along a first lateral direction and a second channel structure extending along the first lateral direction. The second channel structure is spaced apart from the first channel structure. The semiconductor device further includes a high-k dielectric structure extending along the first lateral direction and disposed between the first and second channel structures. The high-k dielectric structure has a bottom surface that comprises a bottommost portion and at least a first plateau portion elevated from the bottommost portion.

In another aspect of the present disclosure, a semiconductor device is disclosed. The semiconductor device includes a plurality of first nanostructures vertically spaced from one another, each of the plurality of first nanostructures extending along a first lateral direction. The semiconductor device further includes a first gate structure extending along a second lateral direction and wrapping around each of the plurality of first nanostructures. The second lateral direction is perpendicular to the first lateral direction. The semiconductor device further includes a first epitaxial structure disposed adjacent the first gate structure along the first lateral direction. The first epitaxial structure is coupled to one end of each of the plurality of first nanostructures. The semiconductor device further includes a high-k dielectric structure disposed adjacent the first gate structure along the second lateral direction. The high-k dielectric structure comprises a first portion extending into the first gate structure along the second lateral direction.

In yet another aspect of the present disclosure, a method for making semiconductor devices is disclosed. The method includes forming a first fin structure and a second fin structure parallel with each other. Each of the first and second fin structures comprises a respective plurality of semiconductor channel layers alternately spaced apart from one another with a respective plurality of semiconductor sacrificial layers. The method further includes forming a semiconductor cladding layer extending along sidewalls of each of the first and second fin structures, lining a trench between the first and second fin structure with a nitride-based dielectric layer, and filling the trench with an oxide-based layer. The method further includes replacing a portion of the semiconductor cladding layer, a portion of the nitride-based dielectric layer, and a portion of the oxide-based layer with a high-k dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first channel structure extending along a first direction;
a second channel structure extending along the first direction and spaced apart from the first channel structure;
a high-k dielectric structure extending along the first direction and disposed between the first and second channel structures; and
a gate cut structure comprising an insulating material;
wherein the high-k dielectric structure has a bottom surface that comprises a bottommost portion and at least a first plateau portion elevated from the bottommost portion, and a top surface in contact with the gate cut structure, wherein the bottom surface further comprises a first tilted portion and a second tilted portion.

2. The semiconductor device of claim 1, wherein the bottom surface further comprises a second plateau portion elevated from the bottommost portion.

3. The semiconductor device of claim 2, wherein the first and second plateau portions extend away from the bottommost portion along a second lateral direction perpendicular to the first direction, respectively.

4. The semiconductor device of claim 2, wherein the first tilted portion is at an angle equal to or less than 30 degrees.

5. The semiconductor device of claim 1, wherein the first tilted portion connects the bottommost portion to the first plateau portion, and the second tilted portion connects the bottommost portion to the second plateau portion.

6. The semiconductor device of claim 1, wherein a height difference between the bottommost portion and the first plateau portion is equal to or less than about 2 nanometers.

7. The semiconductor device of claim 1, wherein each of the first and second channel structures includes a plurality of nanostructures vertically spaced apart from one another.

8. The semiconductor device of claim 1, further comprising at least one dielectric layer lining along a trench interposed between the first and second channel structures, wherein the high-k dielectric structure is disposed above the dielectric layer, wherein the dielectric layer includes at least a portion interposed between the bottommost portion and the first plateau portion of bottom surface of the high-k dielectric structure.

9. The semiconductor device of claim 1, further comprising:
a first metal gate structure straddling the first channel structure; and
a second metal gate structure straddling the second channel structure;
wherein the first and second metal gate structures are isolated from each other at least with the high-k dielectric structure.

10. A semiconductor device, comprising:
a plurality of first nanostructures vertically spaced from one another, each of the plurality of first nanostructures extending along a first direction;
a first gate structure extending along a second direction and at least partially wrapping around each of the plurality of first nanostructures, the second direction perpendicular to the first direction;
a first epitaxial structure disposed adjacent the first gate structure along the first direction, the first epitaxial structure coupled to one end of each of the plurality of first nanostructures;
a high-k dielectric structure disposed adjacent the first gate structure along the second direction; and
a gate cut structure comprising an insulating material;
wherein the high-k dielectric structure comprises a first portion extending into the first gate structure along the second direction and is in contact with the gate cut structure, wherein the high-k dielectric structure comprises a second portion vertically lower than the first portion and wherein a height difference between a bottom surface of the first portion and a bottom surface of the second portion is equal to or less than about 2 nanometers.

11. The semiconductor device of claim 10, wherein the high-k dielectric structure has a lengthwise direction extending along the first direction across the plurality of first nanostructures.

12. The semiconductor device of claim 10, wherein the high-k dielectric structure has a bottom surface that comprises a bottommost portion and at least a first plateau portion elevated from the bottommost portion, and a top surface in contact with the gate cut structure.

13. The semiconductor device of claim 12, wherein the bottom surface further comprises a first tilted portion and a second tilted portion.

14. The semiconductor device of claim 10, further comprising:
a plurality of second nanostructure vertically spaced from one another, each of the plurality of second nanostructures extending along the first direction;
a second gate structure extending along the second direction and wrapping around each of the plurality of second nanostructures; and
a second epitaxial structure disposed adjacent the second gate structure along the first direction, the second epitaxial structure coupled to one end of each of the plurality of second nanostructures;
wherein the high-k dielectric structure is disposed between the first gate structure and the second gate structure to electrically isolate the first gate structure from the second gate structure.

15. The semiconductor device of claim 10, further comprising:
a plurality of third nanostructure vertically spaced from one another, each of the plurality of third nanostructures extending along the first direction;
a plurality of fourth nanostructure vertically spaced from one another, each of the plurality of fourth nanostructures extending along the first direction;
a third gate structure extending along the second direction and wrapping around each of the plurality of third nanostructures;
a fourth gate structure extending along the second direction and wrapping around each of the plurality of fourth nanostructures;
a third epitaxial structure disposed adjacent the third gate structure along the first direction, the third epitaxial structure coupled to one end of each of the plurality of third nanostructures;
a fourth epitaxial structure disposed adjacent the fourth gate structure along the first direction, the fourth epitaxial structure coupled to one end of each of the plurality of fourth nanostructures.

16. A semiconductor device, comprising:
a plurality of nanostructures vertically spaced from one another, each of the plurality of nanostructures extending along a first direction;

a gate structure extending along a second direction and at least partially wrapping around each of the plurality of nanostructures, the second direction perpendicular to the first direction;

a pair of epitaxial structures coupled to ends of each of the plurality of nanostructures, respectively;

a high-k dielectric structure disposed adjacent the gate structure along the second direction; and a gate cut structure comprising an insulating material;

wherein the high-k dielectric structure comprises a top surface in contact with the gate cut structure and wherein the high-k dielectric structure has a bottom surface that comprises a bottommost portion and at least a first plateau portion elevated from the bottommost portion, wherein the bottom surface further comprises a first tilted portion and a second tilted portion.

17. The semiconductor device of claim 16, wherein the high-k dielectric structure has a lengthwise direction extending along the first direction across the plurality of nanostructures.

18. The semiconductor device of claim 16, wherein the high-k dielectric structure comprises a first portion extending into the gate structure along the second direction.

19. The semiconductor device of claim 18, wherein the high-k dielectric structure comprises a second portion vertically lower than the first portion.

20. The semiconductor device of claim 19, wherein a height difference between a bottom surface of the first portion and a bottom surface of the second portion is equal to or less than about 2 nanometers.

* * * * *